(12) United States Patent
Ebihara et al.

(10) Patent No.: US 10,795,469 B2
(45) Date of Patent: Oct. 6, 2020

(54) LAMINATE CONTAINING CONDUCTIVE FIBER, PHOTOSENSITIVE CONDUCTIVE FILM, METHOD FOR PRODUCING CONDUCTIVE PATTERN, CONDUCTIVE PATTERN SUBSTRATE, AND TOUCH PANEL

(71) Applicant: HITACHI CHEMICAL COMPANY, LTD., Tokyo (JP)

(72) Inventors: Masahiko Ebihara, Tokyo (JP); Emiko Oota, Tokyo (JP); Yasuharu Murakami, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/903,304

(22) PCT Filed: Oct. 15, 2014

(86) PCT No.: PCT/JP2014/005236
§ 371 (c)(1),
(2) Date: Jan. 7, 2016

(87) PCT Pub. No.: WO2015/056445
PCT Pub. Date: Apr. 23, 2015

(65) Prior Publication Data
US 2016/0216790 A1    Jul. 28, 2016

(30) Foreign Application Priority Data

Oct. 16, 2013  (JP) ................................. 2013-215513

(51) Int. Cl.
*G06F 3/041* (2006.01)
*H05K 1/02* (2006.01)
(Continued)

(52) U.S. Cl.
CPC .............. *G06F 3/041* (2013.01); *G06F 3/044* (2013.01); *H05K 1/0274* (2013.01);
(Continued)

(58) Field of Classification Search
CPC .................... G06F 3/041; G06F 3/044; G06F 2203/04103; H05K 1/0296; H05K 1/0373;
(Continued)

(56) References Cited

U.S. PATENT DOCUMENTS 8,647,463 B2    2/2014  Yamazaki
2011/0018424 A1  1/2011  Takada
(Continued)

FOREIGN PATENT DOCUMENTS

CN    101186128 A    5/2008
CN    102473475 A    5/2012
(Continued)

OTHER PUBLICATIONS

Office Action of counterpart CN Appln. No. 201510541834.8 dated Mar. 22, 2017.
(Continued)

*Primary Examiner* — Cheng Yuan Huang
(74) *Attorney, Agent, or Firm* — Fitch, Even, Tabin & Flannery, LLP

(57) ABSTRACT

A laminate which includes a substrate 230, conductive fibers 221 and a resin layer, wherein, in said laminate, a ratio of increase in resistance after irradiation with light emitted from a xenon lamp at an intensity of 60 W/m² (integrated value of spectral irradiance at a wavelength of 300 nm to 400 nm) for 300 hours is 20% or less.

7 Claims, 10 Drawing Sheets

(51) Int. Cl.
*H05K 3/02* (2006.01)
*H05K 1/03* (2006.01)
*G06F 3/044* (2006.01)

(52) U.S. Cl.
CPC ......... *H05K 1/0296* (2013.01); *H05K 1/0373* (2013.01); *H05K 3/02* (2013.01); *G06F 2203/04103* (2013.01); *H05K 2201/0302* (2013.01)

(58) Field of Classification Search
CPC . H05K 3/02; H05K 1/0274; H05K 2201/0302
See application file for complete search history.

(56) References Cited

U.S. PATENT DOCUMENTS

| | | | |
|---|---|---|---|
| 2011/0135269 A1 | 6/2011 | Kim et al. | |
| 2011/0147054 A1 | 6/2011 | Yamazaki | |
| 2011/0165514 A1 | 7/2011 | Yamazaki | |
| 2012/0094090 A1* | 4/2012 | Yamazaki | G06F 3/041 428/195.1 |
| 2012/0135241 A1* | 5/2012 | Yasuda | B32B 7/12 428/412 |
| 2012/0138348 A1 | 6/2012 | Yamazaki | |
| 2012/0231248 A1* | 9/2012 | Sato | B32B 27/308 428/213 |
| 2013/0251983 A1 | 9/2013 | Kondo | |
| 2013/0258568 A1 | 10/2013 | Iwata | |
| 2014/0008115 A1* | 1/2014 | Sato | G06F 3/0412 174/258 |
| 2014/0034360 A1 | 2/2014 | Tanaka et al. | |
| 2014/0069488 A1 | 3/2014 | Tanaka | |
| 2014/0124253 A1 | 5/2014 | Yamazaki | |
| 2014/0202531 A1 | 7/2014 | Oya et al. | |
| 2014/0374146 A1 | 12/2014 | Saito et al. | |
| 2015/0166797 A1 | 6/2015 | Iwata | |
| 2015/0166798 A1 | 6/2015 | Iwata | |
| 2016/0246394 A1 | 8/2016 | Yamazaki et al. | |

FOREIGN PATENT DOCUMENTS

| | | | | |
|---|---|---|---|---|
| CN | 103210350 A | | 7/2013 | |
| JP | 2004-195774 A | | 7/2004 | |
| JP | 2011-198642 A | | 10/2011 | |
| JP | 2011-198686 A | | 10/2011 | |
| JP | 2012-190777 A | | 4/2012 | |
| JP | 2012077101 A | * | 4/2012 | ............ C09D 5/032 |
| JP | 2012-190780 A | | 10/2012 | |
| JP | 2012-204022 A | | 10/2012 | |
| JP | 2013-84543 A | | 5/2013 | |
| JP | 2013-196779 A | | 9/2013 | |
| JP | 2013-196918 A | | 9/2013 | |
| JP | 2013-200996 A | | 10/2013 | |
| KR | 2013-0068502 A | | 6/2013 | |
| TW | 201249940 A1 | | 12/2012 | |
| TW | 2013-03906 A1 | | 1/2013 | |
| TW | 201348123 A | | 12/2013 | |
| WO | 2010/010838 A1 | | 1/2010 | |
| WO | 2010/021224 A1 | | 2/2010 | |
| WO | 2011/001961 A1 | | 1/2011 | |
| WO | WO-2012005205 A1 | * | 1/2012 | ............ G06F 3/041 |
| WO | WO-2012133367 A1 | * | 10/2012 | ........... G06F 3/0412 |
| WO | 2013/118875 A1 | | 8/2013 | |
| WO | 2013/146239 A1 | | 10/2013 | |

OTHER PUBLICATIONS

Office Action in corresponding Korean Appln. No. 10-2015-7006070 dated Oct. 16, 2015.
Office Action n corresponding Appln. No. 2015-509656 dated Aug. 14, 2015 with English translation.
International Search Report of PCT/JP2014/005236 dated Jan. 20, 2015 in English.
Office Action in corresponding Taiwan Appln. No. 103135828 dated Feb. 25, 2016.
Official Action issued in corresponding Korean Application No. 2015-7006070 dated Jul. 27, 2016 (8 Pages).
Office Action of TW Appln. No. 103135828 dated Dec. 13, 2016.
Office Action of CN Appln. No. 201480002725.2 dated Dec. 5, 2016.
Office Action of CN Appln. No. 201480002725.2 dated Jul. 13, 2017.

* cited by examiner (a)

(b)

(c)

(a)

(b)

(c)

(d)

LAMINATE CONTAINING CONDUCTIVE FIBER, PHOTOSENSITIVE CONDUCTIVE FILM, METHOD FOR PRODUCING CONDUCTIVE PATTERN, CONDUCTIVE PATTERN SUBSTRATE, AND TOUCH PANEL

The invention relates to a laminate containing conductive fibers, a photosensitive conductive film, a method for producing a conductive pattern, a conductive pattern substrate and a touch panel.

BACKGROUND ART

A liquid crystal display element or a touch screen is used in a large-sized electronic device such as personal computers (PCs) and TVs, and a small-sized electronic device such as a car navigation, a mobile phone and an electronic dictionary, a display of an office automation apparatus, a factory automation apparatus, or the like. These liquid crystal display elements or touch screens are required to have a transparent electrode material. As the transparent electrode material, ITO (Indium-Tin-Oxide), indium oxide or tin oxide is suitable since they exhibit high light transmittance, and hence they constitute the mainstream as an electrode of a substrate or the like of a liquid crystal display element.

Various types of touch panels have been used on the practical basis. In recent years, an electrostatic capacitive touch panel has come to be used more widely. In an electrostatic capacitive touch panel, when a fingertip (conductor) contacts an input surface, the fingertip and the conductive film undergo a capacitive coupling, whereby a capacitor is formed. Therefore, in an electrostatic capacitive touch panel, coordinates are detected by capturing a change in carriers at positions where fingertips contact the touch panel.

In particular, in a projected electrostatic capacitive touch panel, since multiple touch detection by a fingertip is possible, complicated instructions can be implemented, thereby leading to excellent operability. Due to such excellent operability, it has widely been used as an input device on a display surface of a display in an apparatus having a small-sized display such as a mobile phone or a portable music player.

In general, in a projected electrostatic capacitive touch panel, in order to express two-dimensional coordinates formed of the X-axis and the Y-axis, plural X electrodes and plural Y electrodes that orthogonally cross the X electrodes form a two-layered structure. A transparent electrode material is used in these electrodes.

Conventionally, ITO, indium oxide, tin oxide or the like are used in a transparent electrode material. In recent years, an attempt has been made to form a transparent conductive pattern by using other materials than these. For example, Patent Document 1 mentioned below proposes a method for forming a conductive pattern using a photosensitive conductive film having a photosensitive layer containing conductive fibers. By using this technology, a conductive pattern can be formed easily and directly through a photolithographic process on various substrates.

RELATED ART DOCUMENTS

Patent Documents

Patent Document 1: WO2010/021224

SUMMARY OF THE INVENTION

However, as in the case of a photosensitive conductive film disclosed in Patent Document 1, when a sensor electrode (conductive pattern) is formed using conductive fibers as a transparent electrode material, a problem arises that weatherability is deteriorated; specifically, when it is exposed to sunlight or light emitted from a xenon lamp or the like for a long time, a touch panel does not function normally.

An object of the invention is to provide a touch panel that can be operated normally under exposure to sunlight or light emitted from a xenon lamp, as well as to provide a laminate that is provided with a conductive pattern capable of forming the touch panel, a method for producing a conductive pattern and a photosensitive conductive film.

The inventors made intensive studies in order to solve the above-mentioned problem. As a result, they have found that malfunction of a touch panel is caused by an increase in resistance or disconnection of a conductive pattern under exposure to light, and they have invented a method for suppressing an increase in resistance or disconnection of a conductive pattern under exposure to light.

According to the invention, the following laminate, photosensitive conductive film, touch panel or the like are provided.

1. A laminate which comprises a substrate, conductive fibers and a resin layer, wherein, in said laminate, a ratio of increase in resistance after irradiation with light emitted from a xenon lamp at an intensity of 60 W/m$^2$ (integrated value of spectral irradiance at a wavelength of 300 nm to 400 nm) for 300 hours is 20% or less.
2. The laminate according to 1, wherein the laminate has a shield part.
3. The laminate according to 1 or 2, wherein the conductive fibers are silver fibers.
4. A photosensitive conductive film which comprises a supporting film and a photosensitive layer which is provided on the supporting film and comprises conductive fibers, wherein
    the photosensitive layer comprises a binder polymer, a photopolymerizable compound, a photopolymerization initiator and a metal additive.
5. The photosensitive conductive film according to 4, wherein the metal additive is metal particles, metal oxide particles or a metal complex compound.
6. The photosensitive conductive film according to 4 or 5, wherein the metal of the metal additive is aluminum, titanium or zirconium.
7. The photosensitive conductive film according to any one of 4 to 6, wherein the photosensitive layer further comprises an amine additive.
8. The photosensitive conductive film according to 7, wherein the amine additive is an amino group-containing silane compound.
9. The photosensitive conductive film according to any one of 4 to 8, wherein the photosensitive layer further comprises a UV absorbing agent.
10. The photosensitive conductive film according to any one of 4 to 9, wherein the conductive fibers are silver fibers.
11. A method for producing a conductive pattern which comprises:
    an exposure step in which the photosensitive layer of the photosensitive conductive film according to any one of 4 to 10 is arranged on a substrate and the photosensitive layer is irradiated with active rays in a pattern form; and
    a development step in which an unexposed part of the photosensitive layer is removed, thereby to form a conductive pattern.

12. A conductive pattern substrate which comprises a substrate and, on the substrate, a conductive pattern produced by the method for producing a conductive pattern according to 11.

13. A touch panel sensor which comprises the laminate according to any one of 1 to 3 or the conductive pattern substrate according to 12.

According to the invention, it is possible to provide a touch panel that can be operated normally under sunlight or light emitted from a xenon lamp or the like, a laminate provided with a conductive pattern that can constitute the touch panel, a method for producing a conductive pattern and a photosensitive conductive film.

MODE FOR CARRYING OUT THE INVENTION

Figure 1:
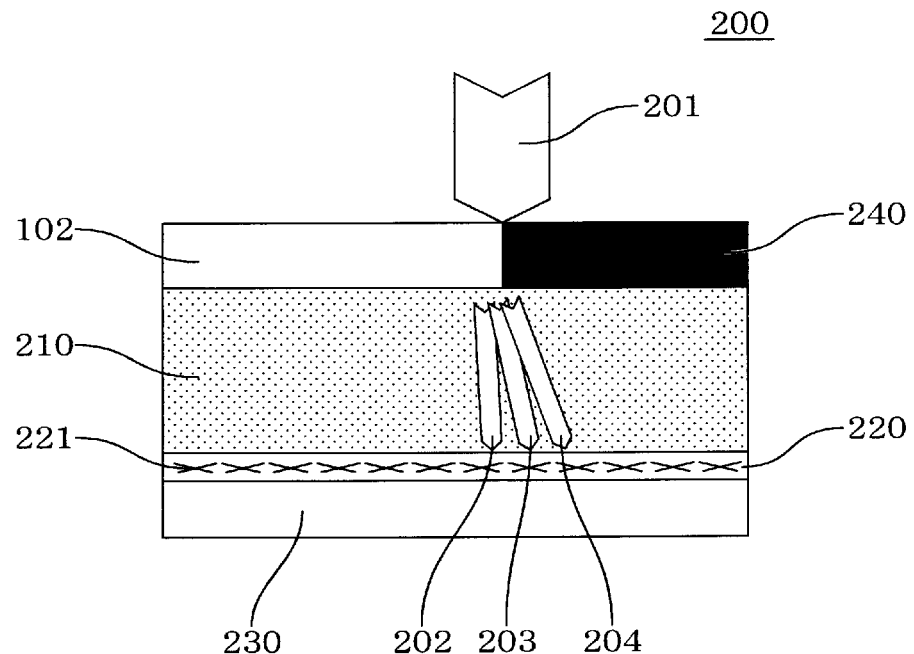
FIG. 1 is a view showing the mechanism of disconnection at the boundary of a shield part.

Hereinbelow, a preferable embodiment of the invention will be explained in detail. In the present specification, the "(meth)acrylate" means "acrylate" and "methacrylate" corresponding thereto. Similarly, the "(meth)acrylic acid" means "acrylic acid" and "methacrylic acid", and the "(meth)acrylic group" means "acrylic group" and "methacrylic group". The numerical range indicated by using "to" means a range that includes numerical values before and after the "to" which are respectively the minimum value and the maximum value.

The inventors examined the cause of improper operation of a touch panel by irradiation with light, and have confirmed that the improper operation is caused by an increase in resistance or disconnection of a conductive pattern. Further specifically, the inventors have found that the improper operation is caused by disconnection of silver nanowires used as a transparent electrode material.

As a result of a detailed examination of a sensor electrode after light irradiation, it has been revealed that an increase in resistance or disconnection of the sensor electrode occurs according to the following two mechanisms: i.e. (i) deterioration of silver nanowires by exposure to UV rays; and (ii) deterioration of silver nanowires by exposure to visible rays.

(i) The mechanism of deterioration of silver nanowires by exposure to UV rays is as follows: first, a resin composition contained in a conductive pattern is deteriorated by exposure to UV rays, and finally, an acid (acetic acid, etc.) is generated. This acid corrodes or deteriorates silver nanowires. Due to deterioration of silver nanowires by an acid, an increase in resistance or disconnection of the sensor electrode occurs.

(ii) The mechanism of deterioration of silver nanowires by exposure to visible rays is as follows: silver nanowires absorb visible rays, and the silver nanowires are ionized and dispersed in a resin composition of a conductive pattern. Due to ionization and dispersion in a resin, silver nanowires are thinned, finally disconnected, and the sensor electrode suffers an increase in resistance and disconnection.

Deterioration of silver nanowires by exposure to visible rays hardly proceeds under conditions where silver nanowires are simultaneously exposed to UV rays and visible rays. Under conditions where UV rays are shielded and silver nanowires is exposed to only visible rays, deterioration tends to proceed easily.

The inventors examined a sensor electrode that suffered an increase in resistance or disconnection by exposure to light. As a result, the inventors have found that, roughly divided, a sensor electrode is disconnected at two parts. That is, a sensor electrode is disconnected at a view area (1) and a shield part boundary (2). In the case of a smartphone or a tablet PC, in particular, a shield part boundary means a boundary between a shield part such as a decorative printed part and a view area. As a result of extensive studies made by the inventors, they have found that disconnection of a view area (1) is mainly caused by the deterioration of silver nanowires by exposure to UV rays as mentioned in (i). Further, the inventors have found that disconnection at the shield part boundary (2) is mainly caused by exposure to visible rays as mentioned in (ii).

The mechanism of disconnection at the shield part boundary (2) will be explained with reference to FIG. 1. In FIG. 1, 102 indicates a touch screen, 200 indicates a touch panel, 201 indicates light or sunlight, 202 indicates UV rays, 203 indicates visible rays, 204 indicates infrared rays, 210 indicates OCA (Optically Clear Adhesive), 220 indicates a sensor electrode, 221 indicates silver nanowires, 230 indicates a substrate and 240 indicates a shield part (decorative printed part).

First, light 201 that irradiates the boundary between the shield part 240 and the view area 102 diffracts at the boundary of the shield part. Since the degree of diffraction depends on the wavelength of light, the light is separated into the UV rays 202, the visible rays 203 and the infrared rays 204 until the light that is diffracted at the shield part boundary strikes silver nanowires of the sensor electrode. That is, in the sensor electrode at the shield part boundary, a part where the UV rays 202 and the visible rays 203 separately strike by spectral diffraction is present locally. Accordingly, since only the visible rays 203 strike the silver nanowires 221 by spectral diffraction, the silver nanowires deteriorate by the mechanism mentioned in (ii) above (deterioration of the silver nanowires by exposure to the visible rays), whereby an increase in resistance or disconnection of the sensor electrode occurs.

Based on the above-mentioned finding, the inventors have found that, in a laminate comprising a conductive pattern and a resin layer, if a ratio of increase in resistance in a part that is irradiated for 300 hours with light emitted from a xenon lamp at an intensity of 60 W/m$^2$ (integrated value of spectral irradiance at a wavelength of 300 nm to 400 nm) is 20% or less, disconnection can be effectively prevented. The invention has been completed based on this finding. Further, the inventors have found a specific method for suppressing such ratio of increase in resistance to 20% or less.

The laminate of the invention is a laminate that comprises a substrate, conductive fibers and a resin layer and has a ratio of increase in resistance in a part that is irradiated for 300 hours with light emitted from a xenon lamp at an intensity of 60 W/m$^2$ (integrated value of spectral irradiance at a wavelength of 300 nm to 400 nm) of 20% or less. If the laminate has a shield part, the increase in resistance at the end part of the shield part is also 20% or less. The ratio of increase in resistance is measured by using an out-cell type sample or a cover glass-integrated type sample as mentioned in the Examples.

Such a laminate can be produced by using the following photosensitive conductive film.

For example, use is made of a photosensitive conductive film comprising a supporting film having thereon a photosensitive layer comprising conductive fibers and the photosensitive layer comprises a metal additive in addition to a binder polymer, a photopolymerizable compound and a photopolymerization initiator.

Specifically, on a substrate, the photosensitive conductive film is laminated (transferred), and then irradiated with active rays in a pattern form. An unexposed part of the photosensitive layer is removed, whereby a conductive pattern is formed. As a result, a laminate in which a conductive pattern is provided on the substrate can be obtained. For example, as shown in FIG. 4(c) and FIG. 5(d), the conductive pattern comprises a resin layer and conductive fibers. The substrate, the resin layer and the conductive fibers are arranged in this sequence.

Due to incorporation of a metal additive, deterioration or disconnection of silver nanowires by exposure to visible rays can be greatly suppressed. The reason therefor is assumed to be as follows: by movement of energy obtained by absorption of visible rays by silver nanowires to the metal additive, granulation of silver nanowires and dispersion of the granulated silver nanowires in the resin are suppressed.

Further, due to incorporation of the metal additive in the cured resin layer, deterioration or disconnection by exposure to UV rays can be suppressed. The reason is assumed to be as follows: an acid that is generated by decomposition of the cured resin layer by UV rays and the metal additive are reacted, whereby deterioration of silver nanowires by an acid is suppressed.

The photosensitive conductive film may contain an amine additive. The amine additive has an effect of increasing the resistance to light. The reason therefor is assumed that an acid that is generated by decomposition of the resin layer by exposure to UV rays and an amine are reacted to neutralize the acid, deterioration of silver nanowires by the acid is suppressed.

Hereinbelow, a detailed explanation will be made on the invention.

<Photosensitive Conductive Film>

Figure 2:
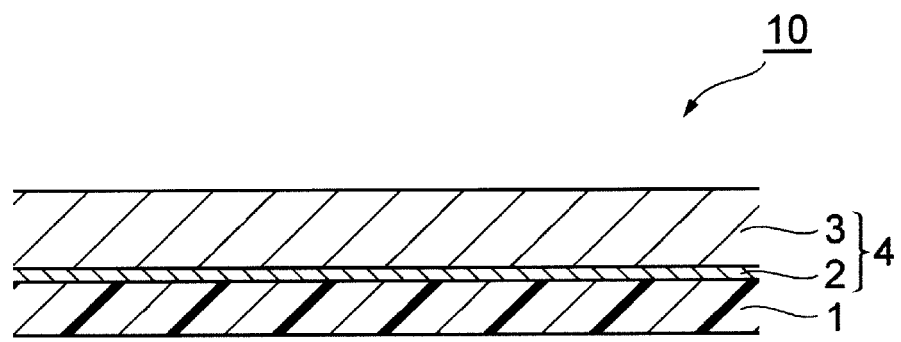
FIG. 2 is a schematic cross-sectional view showing one embodiment of the photosensitive conductive film.

The photosensitive conductive film according to the invention comprises a supporting film and a photosensitive layer that comprises conductive fibers and is provided on the supporting film. One embodiment of the photosensitive conductive film is shown in FIG. 2. The photosensitive conductive film 10 comprises a supporting film 1 and a photosensitive layer 4. The photosensitive layer 4 comprises a conductive film 2 and a photosensitive resin layer 3. As for the photosensitive conductive film, as shown in FIG. 2, the boundary between the conductive film 2 comprising conductive fibers and the photosensitive resin layer 3 provided on the conductive film 2 may be clearly divided. Alternatively, the boundary between the conductive film 2 and the photosensitive resin layer 3 may not necessarily be clearly divided. Any conductive film may be used as long as conductivity can be obtained in the plane direction of the photosensitive layer. It may have a configuration in which the conductive film is mixed with the photosensitive resin layer. For example, a composition that constitutes a photosensitive resin layer may be impregnated in the conductive film or a composition that constitutes a photosensitive resin layer may be present on the surface of the conductive film.

The photosensitive layer of the invention comprises a binder polymer, a photopolymerizable compound, a photopolymerization initiator and a metal additive. Further, the photosensitive layer of the invention may contain an amine additive. In the invention, an amine additive does not include a metal. A metal additive and an amine additive may be added to any one of a conductive film and a photosensitive resin layer or to both of them.

A detailed explanation will be made on each of the supporting film 1, the conductive film 2 and the photosensitive resin layer 3 that constitute the photosensitive conductive film 10.

As the supporting film 1, a polymer film having heat resistance and solvent resistance such as a polyethylene terephthalate film, a polyethylene film, a polypropylene film and a polycarbonate film can be given. Among these, in respect of transparency or heat resistance, a polyethylene terephthalate film is preferable. These polymer films are removed from the photosensitive layer 4 at a later stage. Therefore, it is preferred that these films be not subjected to a surface treatment that makes the removal impossible, and that these films be not formed of materials that make the removal impossible.

The thickness of the supporting film 1 is preferably 5 to 300 μm, more preferably 10 to 200 μm, with 15 to 100 μm being particularly preferable. In respect of preventing the breakage of the supporting film due to lowering in mechanical strength in the step where a conductive dispersion is applied to form the conductive film 2 or a photosensitive resin composition is applied to form a photosensitive resin layer 3 or in the step where the supporting film is peeled prior to the development of the exposed photosensitive resin layer 3, the thickness of the supporting film is preferably 5 µm or more, more preferably 10 µm or more, with 15 µm or more being further preferable. Further, in respect of excellent resolution of a pattern after the irradiation of the photosensitive resin layer with active rays through the supporting film, the thickness is preferably 300 µm or less, more preferably 200 µm or less, with 100 µm or less being further preferable.

In respect of improving sensitivity and resolution, the haze value of the supporting film 1 is preferably 0.01 to 5.0%, more preferably 0.01 to 3.0%, further preferably 0.01 to 2.0%, with 0.01 to 1.0% being particularly preferable. The haze value can be measured with reference to JIS K 7375 (established in 2008). Further, it can be measured by means of a commercially available turbidimeter such as NDH-1001DP (product name, manufactured by Nippon Denshoku Industries, Co., Ltd.).

As for the conductive film 2, as the conductive fiber, fibers of a metal such as gold, silver, copper, platinum or the like or carbon fibers such as a carbon nanotube or the like can be given. In the invention, when conductive fibers comprising silver nanowires are used, advantageous effects are exhibited.

Figure 3:
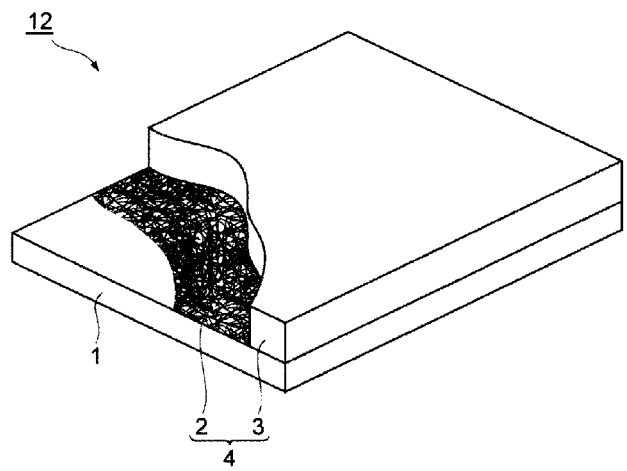
FIG. 3 is a partially-cutaway perspective view showing one embodiment of the photosensitive conductive film.

FIG. 3 is a partially cut-away perspective view showing one embodiment of the photosensitive conductive film. As shown in FIG. 3, it is preferred that the conductive film 2 have a network structure in which conductive fibers are brought into contact with each other. The conductive film 2 having such a network structure may be formed on the surface of the supporting film 1 side of the photosensitive resin layer 3. However, as long as conductivity can be obtained in the plane direction on the surface of the photosensitive layer 4 that is exposed when the supporting film 1 is peeled, the conductive film 2 may be formed such that a part of the photosensitive layer 3 enters into the conductive film 2 or, alternatively, the conductive film 2 may be formed such that the conductive film 2 is included in the surface layer on the supporting film 1 side of the photosensitive resin layer 3.

The conductive fibers containing the above-mentioned silver nanowires can be prepared by a method in which silver ions are reduced with a reducing agent such as $NaBH_4$ or by the polyol method.

The fiber diameter of the conductive fibers is preferably 1 nm to 50 nm, more preferably 2 nm to 20 nm, and further preferably 3 nm to 10 nm. The fiber length of the conductive fibers is preferably 1 µm to 100 µm, more preferably 2 µm to 50 µm, and further preferably 3 µm to 10 µm. The fiber diameter and the fiber length can be measured by means of a scanning electron microscope.

In the conductive film 2, an organic conductor may be used together with the conductive fibers. Although no particular restrictions are imposed on the organic conductor, it is preferable to use an organic conductor such as a polymer including a thiophene derivative or an aniline derivative.

Specifically, it is possible to use polyethylene dioxythiophene, polyhexylthiophene, polyaniline, polyvinylpyrrolidone or the like.

The thickness of the conductive film 2 depends on the application of the conductive pattern formed by using the photosensitive conductive film of the invention or required conductivity. However, the thickness is preferably 1 µm or less, more preferably 1 nm to 0.5 µm, and further preferably 5 nm to 0.1 µm. If the thickness of the conductive film 2 is 1 µm or less, the light transmittance in a wavelength region of 450 nm to 650 nm is high, leading to excellent pattern forming property. Therefore, this thickness is preferable for forming a transparent electrode. The thickness of the conductive film 2 means a value measured by a scanning electron microscope.

The conductive film 2 can be formed by coating, on the supporting film 1, a conductive dispersion liquid obtained by adding to water and/or an organic solvent the conductive fibers or the organic conductor mentioned above and a dispersion stabilizer such as a surfactant, followed by drying. After the drying, the conductive film 2 formed on the supporting film 1 may be laminated, according to need.

Coating can be conducted by a known method such as roll-coating, comma coating, gravure coating, air knife coating, die coating, bar coating and spray coating. The drying can be conducted at 30 to 150° C. for 1 to 30 minutes by means of a hot air convection heater, or the like. In the conductive film 2, the conductive fibers or the organic conductor may co-exist with a surfactant or a dispersion stabilizer.

According to need, a metal additive or an amine additive may be added to the conductive dispersion liquid. By adding such additives, a metal additive or an amine additive can be incorporated into a conductive pattern containing the conductive film formed by coating the conductive dispersion, followed by drying.

As the photosensitive resin layer 3, one formed of a photosensitive resin composition that comprises a binder polymer (A), a photopolymerizable compound (B) and a photopolymerization initiator (C) can be given. The photosensitive resin composition may contain a metal additive (D) and/or an amine additive (E).

As the binder polymer (A), acrylic resins, styrene resins, epoxy resins, amide resins, amide epoxy resins, alkyd resins, phenol resins, ester resins, urethane resins, epoxyacrylate resins obtained by a reaction of epoxy resins and (meth) acrylic resins and an acid-modified epoxy acrylate resin obtained by a reaction of an epoxy acrylate resin and an acid anhydride or the like can be given. These resins can be used alone or in combination of two or more.

Among these, in respect of excellent alkaline developability and film-forming property, it is preferable to use an acrylic resin. It is more preferred that the acrylic resin contain a monomer unit derived from (meth)acrylic acid or a (meth)acrylic alkyl ester as a constitution unit. Here, the "acrylic resin" means a polymer that mainly has a monomer unit derived from a polymerizable monomer having a (meth) acrylic group.

As the acrylic resin, one produced by subjecting a polymerizable monomer having a (meth)acrylic group to radical polymerization can be used.

As the polymerizable monomer having the (meth)acrylic group, acrylamide such as diacetone acrylamide; (meth) acrylic acid ester such as (meth)acrylic acid alkyl ester, 2-hydroxyalkyl(meth)acrylates, (meth)acrylic acid tetrahydrofurfuryl ester, (meth)acrylic acid dimethylaminoethyl ester, (meth)acrylic acid diethylaminoethyl ester, (meth) acrylic acid glycidyl ester, 2,2,2-trifluoroethyl (meth)acrylate, 2,2,3,3-tetrafluoropropyl(meth)acrylate; (meth)acrylic acid such as (meth)acrylic acid, α-bromo(meth)acrylic acid, α-chloro(meth)acrylic acid, β-furyl(meth)acrylic acid and β-styryl(meth)acrylic acid can be given.

As for the acrylic resin mentioned above, in addition to the above-mentioned polymerizable monomer having a (meth)acrylic group, one or two or more of polymerizable monomers such as a styrene derivative, acrylonitrile, vinyl alcohol esters such as vinyl-n-butyl ether; maleic acid, maleic acid anhydride, maleic monoester such as maleic monomethyl, maleic monoethyl and maleic monoisopropyl, fumaric acid, cinnamic acid, α-cyanocinnamic acid, itaconic acid and crotonic acid may be copolymerized.

As the (meth)acrylic acid alkyl ester, (meth)acrylic acid methyl ester, (meth)acrylic acid ethyl ester, (meth)acrylic acid propyl ester, (meth)acrylic acid butyl ester, (meth) acrylic hexyl ester, (meth)acrylic acid heptyl ester, (meth) acrylic octyl ester, (meth)acrylic 2-ethylhexyl ester and (meth)acrylic acid nonyl ester can be given. These can be used alone or in a combination of two or more.

In respect of further improving alkaline developability, it is preferred that the binder polymer (A) have a carboxyl group. As the polymerizable monomer having a carboxyl group, (meth)acrylic acid mentioned above can be given.

The ratio of the polymerizable monomer having a carboxy group in the binder polymer (A) relative to the entire polymerizable monomer used is preferably 10 to 50 mass %, more preferably 12 to 40 mass %, further preferably 15 to 30 mass %, and particularly preferably 15 to 25 mass %. In respect of excellent alkali developability, the ratio is preferably 10 mass % or more, and in respect of excellent alkali resistance, the ratio is preferably 50 mass % or less.

The weight-average molecular weight of the binder polymer (A) is preferably 5,000 to 300,000, more preferably 20,000 to 150,000 and further preferably 30,000 to 100,000 in respect of well-balanced mechanical strength and alkaline developabiliy. In respect of resistance to a developing liquid, the weight-average molecular weight is preferably 5,000 or more. In respect of development time, the weight-average molecular weight is preferably 300,000 or less. The weight-average molecular weight in the invention is a value measured by the gel permeation chromatography (GPC) and converted by a calibration curve prepared by standard polystyrene.

Then, an explanation will be made on the photopolymerizable compound (B). It is preferred that the photopolymerizable compound have an ethylenically unsaturated bond.

As the photopolymerizable compound having an ethylenically unsaturated bond, bisphenol A di(meth)acrylate compound such as 2,2-bis(4-((meth)acryloxypolyethoxy) phenyl)propane, 2,2-bis(4-((meth)acryloxypolypropoxy) phenyl)propane and 2,2-bis(4-((meth)acryloxypolyethoxypolypropoxy)phenyl) propane; polyalkylene glycol di(meth) acrylate such as polyethylene glycol di(meth)acrylate, polypropylene glycol di(meth)acrylate and polyethylene polypropylene glycol di(meth)acrylate; trimethylolpropane (meth)acrylate such as trimethylolpropane di(meth)acrylate, trimethylolpropane tri(meth)acrylate, trimethylolpropane ethoxy tri(meth)acrylate and trimethylolpropane triethoxy tri(meth)acrylate; tetramethylolmethane (meth)acrylate such as tetramethylol methane tri(meth)acrylate and tetramethylolmethane tetra(meth)acrylate; dipentaerythritol (meth) acrylate such as dipentaerythritol penta(meth)acrylate and dipentaerythritol hexa(meth)acrylate; urethane monomers or the like can be given.

The amount ratio of the photopolymerizable compound (B) is preferably 30 to 80 mass %, more preferably 40 to 70 mass %, relative to 100 mass % in total of the binder polymer and the photopolymerizable compound. In respect of light curability and coating property of a transferred conductive film (conductive film and photosensitive resin layer), the amount ratio of the photopolymerizable compound is preferably 30 mass % or more. In respect of storage stability when wound as a film, the amount ratio of the photopolymerizable compound is preferably 80 mass % or less.

Next, an explanation will be made on photopolymerization initiator (C). No specific restrictions are imposed on the photopolymerization initiator as long as it is one whose wavelength necessary for exhibiting its function matches the wavelength of light emitted from an exposure machine. Examples thereof include aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone and 2-benzyl-2-dimethylamino-1-(4-morpholinophenyl)-butanone-1,2-methyl-1-[4-(methylthio)phenyl]-2-morpholinopropanone-1; benzoinether compounds such as benzoin methyl ether, benzoin ethyl ether and benzoin phenyl ether; a benzoin compound such as benzoin, methylbenzoin and ethylbenzoin; an oxime ester compound such as 1,2-octanedione-1-[4-(phenylthio)phenyl]-2-(O-benzoyloxime) and 1-[9-ethyl-6-(2-methylbenzoyl)-9H-carbazol-3-yl]ethanone 1-(O-acetyloxime); benzyl derivatives such as benzyldimethylketal; 2,4,5-triarylimidazole dimer such as 2-(o-chlorophenyl)-4,5-diphenyl imidazole dimer, 2-(o-chlorophenyl)-4,5-di(methoxyphenyl)imidazole dimer, 2-(o-fluorophenyl)-4,5-diphenyl imidazole dimer, 2-(o-methoxyphenyl)-4,5-diphenyl imidazole dimer and 2-(p-methoxyphenyl)-4,5-diphenylimidazole dimer; an acrylidine derivative such as 9-phenylacrylidine and 1,7-bis (9,9'-acrylidinyl)heptane; N-phenylglycine, N-phenylglycine derivatives and oxazole-based compounds.

Among these, in respect of transparency and pattern forming capability at 10 μm or less, an oxime ester compound is preferable. As the oxime ester compound, compounds represented by the following general formulas (C-1) and (C-2) can be given. In respect of quick curing and transparency, a compound represented by the following general formula (C-1) is preferable.

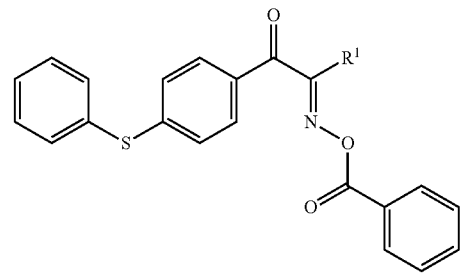

(C-1)

In the general formula (C-1), $R^1$ is an alkyl group having 1 to 12 carbon atoms or a cycloalkyl group having 3 to 20 carbon atoms. Among these, $R^1$ is preferably an alkyl group having 3 to 9 carbon atoms.

As long as the advantageous effects of the invention are not inhibited, the aromatic ring in the general formula (C-1) may contain a substituent. As the substituent, a hydrogen atom or an alkyl group having 1 to 12 carbon atoms can be given.

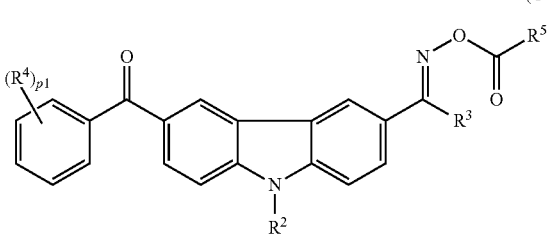

(C-2)

In the general formula (C-2), $R^2$ is a hydrogen atom or an alkyl group having 1 to 12 carbon atoms; $R^3$ is an alkyl group having 1 to 12 carbon atoms or a cycloalkyl group having 3 to 20 carbon atoms; $R^4$ is an alkyl group having 1 to 12 carbon atoms and $R^5$ is an alkyl group having 1 to 20 carbon atoms or an aryl group. p1 is an integer of 0 to 3. When p1 is 2 or more, plural $R^4$s may be the same or different. As long as the advantageous effects of the invention are not impaired, a substituent may be present on the carbazole. As the substituent, a hydrogen atom or an alkyl group having 1 to 12 carbon atoms can be given.

In the general formula (C-2), $R^2$ or $R^4$ is preferably an alkyl group having 1 to 12 carbon atoms, more preferably an alkyl group having 1 to 8 carbon atoms, and further preferably an alkyl group having 1 to 4 carbon atoms.

In the general formula (C-2), it is preferred that $R^3$ be an alkyl group having 1 to 8 carbon atoms or a cycloalkyl group having 4 to 15 carbon atoms. $R^3$ is more preferably an alkyl group having 1 to 4 carbon atoms or a cycloalkyl group having 4 to 10 carbon atoms. A methyl group and an ethyl group are particularly preferable.

In the general formula (C-2), it is preferred that $R^5$ be an alkyl group having 1 to 12 carbon atoms or an aryl group having 6 to 16 carbon atoms. $R^5$ is more preferably an alkyl group having 1 to 8 carbon atoms or an aryl group having 6 to 14 carbon atoms, further preferably an alkyl group having 1 to 4 carbon atoms or an aryl group having 6 to 12 carbon atoms.

As the compound represented by the general formula (C-1), 1,2-octanedione, 1-[4-(phenylthio)-phenyl, 2-(O-benzoyloxime)] or the like can be given. As the compound represented by the general formula (C-2), ethanone, 1-[9-ethyl-6-(2-methylbenzoyl)-9H-carbazol-3-yl]-, 1-(O-acetyloxime) or the like can be given. 1,2-octanedione, 1-[4-(phenylthio)-phenyl, 2-(O-benzoyloxime)] is commercially available as IRGACURE OXE 01 (product name, manufactured by BASF Japan Ltd.). Moreover, ethanone, 1-[9-ethyl-6-(2-methylbenzoyl)-9H-carbazol-3-yl]-,1-(O-acetyloxime) is commercially available as IRGACURE OXE 02 (product name, manufactured by BASF Japan Ltd.). These are used alone or in combination of two or more.

Among the compounds represented by the general formula (1), 1,2-octanedione, 1-[4-(phenylthio)-phenyl, 2-(O-benzoyloxime)] is particularly preferable.

The amount ratio of the photopolymerization initiator is preferably 0.1 to 20 parts by mass, more preferably 1 to 10 parts by mass, particularly preferably 1 to 5 parts by mass, relative to 100 parts by mass of the total of the binder polymer and the photopolymerizable compound. In respect of excellent light sensitivity, the amount ratio is preferably 0.1 parts by mass or more, and in respect of excellent light curability, the amount ratio is preferably 20 parts by mass or less.

Next, an explanation will be made on the metal additive (D). A metal additive is an additive that contains a metal. No specific restrictions are imposed on a metal additive. However, in respect of transparency of a photosensitive conductive film, metal particles, metal oxide particles and a metal complex compound are preferable. If transparency is poor, when a conductive pattern is formed by using a photosensitive conductive film, light is scattered at the time of exposure or light does not reach the bottom, resulting in insufficient formation of a conductive pattern.

As metal oxide particles, aluminum oxide particles, titanium oxide particles, zirconium oxide particles or the like can be given. No specific restrictions are imposed on the metal oxide. However, in respect of transparency of the photosensitive conductive film, it is preferred that the primary particle size be 100 nm or less. Among the metal oxide particles, in respect of easiness in availability, low cost and effective prevention of deterioration of silver nanowires by exposure to visible rays, titanium oxide particles are particularly preferable.

The metal additive (D) in the invention is preferably a metal complex compound in respect of solubility in a photosensitive resin. Due to incorporation of a metal complex in a photosensitive conductive film, deterioration or disconnection of silver nanowires by exposure to visible rays can be significantly suppressed.

The metal complex compound is preferably a compound represented by the following general formula (2).

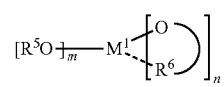
(2)

In the formula (2), $M^1$ is a metal atom such as aluminum, titanium or zirconium. In respect of stability of an uncured product of the photosensitive conductive film, titanium is preferable. In respect of transparency of the photosensitive conductive film, zirconium and aluminum are preferable. While the photosensitive conductive film is colored yellow when titanium is used, zirconium and aluminum hardly cause the photosensitive conductive film to be colored and allow the film to attain high transparency.

m is an integer of 0 to 4, n is an integer of 0 to 4, and the sum of m and n is 3 or 4 (when $M^1$ is aluminum, the sum of m and n is 3, and when $M^1$ is titanium or zirconium, the sum of m and n is 4. The same can be applied to the following).

In respect of stability, m is preferably 0 to 2, and n is preferably 1 to 4.

$R^5$ is independently an alkyl group having 1 to 18 (preferably 1 to 8, more preferably 1 to 6) carbon atoms. Specific examples of an alkyl group having 1 to 18 carbon atoms include a methyl group, an ethyl group, a n-propyl group, an isopropyl group, a n-butyl group, a n-hexyl group, a n-heptyl group, a n-decyl group, an n-dodecyl group or the like can be given. In respect of storage stability, $R^5$ is preferably an isopropyl group.

$R^6$ is independently a monovalent organic group. The monovalent organic group has one or more atoms selected from an oxygen atom and a nitrogen atom that can be coordinated with $M^1$. Preferably, $R^6$ has one or more groups selected from a hydroxyl group, a carbonyl group and an amino group that can be coordinated with $M^1$.

The metal complex compound represented by the formula (2) is preferably a metal complex compound represented by the following formula (2').

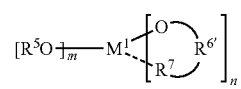
(2')

wherein in the formula, $M^1$, $R^5$, m and n are as defined in the formula (2).

$R^{6'}$ is independently a divalent organic group having 1 to 6 carbon atoms, $R^7$ is independently a group selected from a hydroxyl group, a carbonyl group (preferably an alkylcarbonyl group having 2 to 9 (preferably 2 to 7) carbon atoms), and an amino group.

It is preferred that the metal complex compound represented by the formula (2) be a metal complex compound represented by the following formula (3) in respect of easiness in availability.

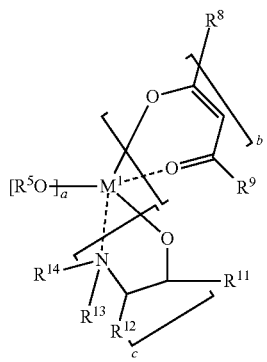

(3)

In the formula (3), $M^1$ is a metal atom selected from aluminum, titanium and zirconium.

a is an integer of 0 to 4, b is an integer of 0 to 4 and c is an integer of 0 to 4, and the sum of a, b and c is 3 or 4.

In respect of easiness in availability, a is preferably 0 to 2, b is preferably 1 to 4 and c is preferably 0 to 2. The sum of "a and b", the sum of "a and c" or "b" is preferably 3 or 4.

$R^5$ in the formula (3) is the same as $R^5$ in the formula (2).

$R^8$ and $R^9$ are independently a hydrogen atom, a hydroxyl group, an alkyl group having 1 to 18 (preferably 1 to 8, more preferably 1 to 6) carbon atoms, an alkyl alcohol residue (alkoxy group) having 1 to 18 (preferably 1 to 8, more preferably 1 to 6) carbon atoms or an aminoalkyl group having 1 to 18 (preferably 1 to 8, more preferably 1 to 6) carbon atoms.

As specific examples of $R^8$ and $R^9$, a hydrogen atom, a hydroxyl group, a methyl group, an ethyl group, a n-propyl group, a 2-propyl group, a n-butyl group, a n-hexyl group, a methyl alcohol residue, an ethyl alcohol residue, a n-propyl alcohol residue, a 2-propyl alcohol residue, an n-butyl alcohol residue, an n-hexyl alcohol residue, an aminomethyl group, an aminoethyl group, an aminopropyl group, an aminobutyl group, an aminohexyl group or the like can be given. In respect of easiness in availability, $R^8$ and $R^9$ are preferably a methyl group.

$R^{11}$ to $R^{14}$ are a hydrogen atom, a hydroxy group, an alkyl group having 1 to 18 (preferably 1 to 8, more preferably 1 to 6) carbon atoms or a hydroxyalkyl group having 1 to 18 (preferably having 1 to 8, more preferably 1 to 6) carbon atoms. Specific examples thereof include a hydrogen atom, a hydroxy group, a methyl group, an ethyl group, a n-propyl group, a 2-propyl group, a n-butyl group, a n-hexyl group, a n-heptyl group, a n-decyl group, a n-dodecyl group, a hydroxymethyl group, a hydroxyethyl group, a hydroxypropyl group, a hydroxybutyl group, a hydroxypentyl group or the like.

Among the metal additives as the component (D), in the metal complex compound represented by the formula (2), as specific examples of the compound in which $M^1$ is titanium, titanium diisopropoxybis(acetylacetonate), titanium tetraacetyl acetonate, titanium di-2-ethylhexoxybis(2-ethyl-3-hydroxy-hexoxide), titanium diisopropoxybis(ethylacetoacetate), titanium diisopropoxybis(triethanolaminate), titanium lactate ammonium salts, titanium lactate can be given.

Among the metal additives as the component (D), in the metal complex compound represented by the formula (2), as specific examples of the compound in which $M^1$ is zirconium, monobutoxy trisacetylacetonate zirconium, dibutoxy bisacetylacetonate zirconium, tributoxy acetylacetonate zirconium, zirconium tetraacetylacetonate, butoxy trisethyl acetyl acetate zirconium, dibutoxy bisethyl acetoacetate zirconium, tributoxy monoethyl acetyl acetate zirconium, tetrakis ethyl lactate zirconium, dibutoxy bisethyl lactate zirconium, bisacetylacetonate bisethyl acetylacetonate zirconium, monoacetylaceto trisethyl acetylacetonate zirconium, monoacetylacetonate bisethyl acetylacetonate butoxy zirconium, bisacetylacetonate bisethyl lactonate zirconium can be given.

Among the metal additives as the component (D), in the metal complex compound represented by the formula (2), as specific examples of the compound in which $M^1$ is aluminum, aluminum ethylacetoacetate diisopropylate, aluminum tris(ethylacetoacetate), aluminum tris(acetylacetonate), alkyl acetoacetate aluminum diisopropylate, aluminum bisethylacetoacetate monoacetylacetonate or the like can be given.

Among the metal additive as the component (D), as specific examples of the aluminum complex compound, a compound represented by the following general formula (4) (aluminum complex) can be given.

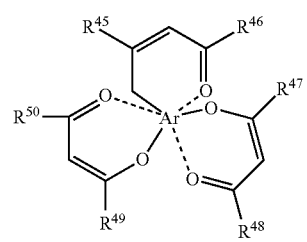

(4)

wherein in the formula $R^{45}$ to $R^{50}$ are independently a hydrogen atom or a monovalent organic group.

As the monovalent organic group represented by $R^{45}$ to $R^{50}$, an alkyl group having 1 to 20 (preferably 1 to 8, more preferably 1 to 6) carbon atoms, an alkoxy group having 1 to 20 (preferably 1 to 8, more preferably 1 to 6) carbon atoms or the like can be given. The three ligands may be the same or different.

As the compound represented by the formula (4), aluminum tris(ethylacetoacetate), aluminum tris(acetylacetonate), aluminum bisethyl acetoacetate monoacetyl acetonate or the like can be given. Among these, aluminum tris(acetylacetonate), aluminum bisethylacetoacetate monoacetyl acetonate or the like can be given.

These metal complex compounds, metal particles and metal oxide particles may be used alone or in combination of two or more.

In respect of stability of an uncured product of the photosensitive conductive film, the metal additive as the component (D) is preferably titanium triethanolaminate, titanium diisopropoxybis(acetylacetonate), titanium tetraacetyl acetonate, zirconium tetraacetylacetonate or aluminum trisacetylacetonate. Titanium triethanolaminate, titanium diisopropoxy bis(acetylacetonate) or titanium tetraacetylacetonate is preferable. In respect of increasing transparency of the photosensitive conductive film, zirconium tetraacetyl acetonate is preferable.

The amount ratio of the component (D) is preferably 0.01 to 20 parts by mass, more preferably 0.1 to 10 parts by mass, and particularly preferably 0.2 to 5 parts by mass, relative to 100 parts by mass of the total of the binder polymer (A) and the photopolymerizable compound (B). In order to sufficiently suppress deterioration of silver nanowires at the time of irradiation of light, the amount ratio of the component (D) is preferably 0.01 part by mass or more. In respect of stability of an uncured product of the photosensitive conductive film and transparency of a photosensitive conductive film, the amount ratio of the component (D) is preferably 20 parts by mass or less.

As the method for allowing the metal additive as the component (D) to be contained in the photosensitive layer, generally, a method in which the metal additive be internally added in advance to a photosensitive resin composition is used. The invention is however not limited to this internal addition. Other methods for incorporating the metal additive (D) into the photosensitive layer include, for example, a method in which the metal additive (D) is internally added to a conductive fiber solution or a method in which, after allowing the conductive film formed on the supporting film to contact (for example, immersion) with a liquid containing the metal additive as the component (D), drying is conducted again to form a conductive film.

Next, an explanation will be made on the amine additive (E).

The amine additive (E) is an additive in which a nitrogen atom having an unshared electron pair shows basicity, and includes a primary amine, a secondary amine and a tertiary amine. In respect of preventing gelation of the photosensitive resin layer 3 by the amine additive (E), it is preferable to use one having a relatively low reactivity. A secondary amine or a tertiary amine is preferable. Further, it is preferable to select one having good compatibility in the photosensitive resin layer or one that is not evaporated during application of the photosensitive resin layer 3. The amine additive (E) may be used alone or in combination of two or more.

As the primary amine, allylamine, isopropylamine, diaminopropylamine, ethylamine, 2-ethylhexylamine, 3-(2-ethylhexyloxy)propylamine, 3-ethoxypropylamine, 3-(diethylamino)propylamine, 3-(dibutylamino)propylamine, t-butylamine, 3-(methylamino)propylamine, 3-(dimethylamino)propylamine, 3-methoxypropylamine, N-methyl-ethylenediamine, N-ethylethylenediamine, N-methyltrimethylenediamine, N-ethyltrimethylenediamine, diethylenetriamine, dipropylenetriamine, 2,4-diamino-6-phenyl-1,3,5-triazine(benzoguanamine), N-(2-aminoethyl)-3-aminopropylmethyldimethoxysilane, N-(2-aminoethyl)-3-aminopropyltrimethoxysilane, 3-aminopropyltrimethoxysilane, 3-aminopropyltriethoxysilane, 3-ureidopropyltriethoxysilane or the like can be given.

As the secondary amine, dipropylamine, diisopropylamine, N-methylethylamine, N-methylpropylamine, N-methylisopropylamine, N-methylbutylamine, N-methylisobutylamine, N-methylcyclohexylamine, N-ethylpropylamine, N-ethylisopropylamine, N-ethylbutylamine, N-ethylisobutylamine, N-ethylcyclohexylamine, N-methylvinylamine, N-methylallylamine, N-methylbenzylamine, N-ethylbenzylamine, N-methylphenytylamine, N-ethylphenethylamine, N,N'-dimethylethylenediamine, N,N'-diethylethylenediamine, N,N'-dimethyltrimethylenediamine, N,N'-diethyltrimethylenediamine, pyrrolidine, piperidine, piperazine, morpholine, thiomorpholine, 3-(phenylamino) propyltrimethoxysilane, 2,2,6,6-tetramethyl-4-piperidyl methacrylate or the like can be given.

As the tertiary amine, tetramethylethylenediamine, N,N-dimethyl-n-octadecylamine, tripropylamine, triisopropylamine, 3-triethoxysilyl-N-(1,3-dimethyl-butylidene)propylamine, N-methylpiperazine, N-ethylpiperazine, acryloylmorpholine or the like can be given.

Among the above-mentioned amine additives, an amino group-containing silane compound such as 3-(phenylamino) propyltrimethoxysilane, N-(2-aminoethyl)-3-aminopropyl-methyldimethoxysilane, N-(2-aminoethyl)-3-aminopropyltrimethoxysilane, 3-aminopropyltrimethoxysilane, 3-aminopropyltrimethoxysilane and 3-ureidopropyltriethoxysilane are preferable.

The amount ratio of the amine additive (E) is preferably 0.1 to 20 parts by mass, more preferably 1 to 10 parts by mass, particularly preferably 3 to 7 parts by mass relative to 100 parts by mass of the total of the binder polymer (A) and the photopolymerizable compound (B). In order to sufficiently suppress deterioration of silver nanowires by exposure to UV rays, the amount ratio of the amine additive is preferably 0.1 part by mass or more. In respect of stability of an uncured product of a photosensitive conductive film and transparency of a photosensitive conductive film, the amount ratio of the amine additive (E) is preferably 20 parts by mass or less.

As the method for incorporating the amine additive as the component (E) into the photosensitive layer, generally, a method in which the amine additive is internally added in advance to the photosensitive resin composition is used. The invention is not limited to internal addition. Other methods for incorporating the amine additive (E) into the photosensitive layer include, for example, a method in which the amine additive (E) is internally added to a conductive fiber solution or a method in which, after allowing the conductive film formed on the supporting film to be exposed to a liquid containing the amine additive as the component (E), drying is conducted again to form a conductive film.

An explanation will be made on a UV absorbing agent. By incorporating a UV absorbing agent in the photosensitive layer that contains a metal additive, light resistance can be greatly improved. Specifically, by adding the metal additive (D) to the photosensitive layer, in addition to effects of suppressing deterioration or disconnection of a nanowire by exposure to UV rays and visible rays, the amount of UV rays absorbed by the photosensitive layer is decreased due to the presence of a UV absorbing agent in the photosensitive layer, and as a result, the amount of an acid generated by decomposition of the resin by exposure to UV rays is decreased, whereby deterioration of silver nanowires by an acid can be suppressed. That is, by adding a UV absorbing agent to the photosensitive layer that includes the metal additive (D), as compared with a case where the photosensitive layer contains only the metal additive (D), deterioration or disconnection of silver nanowires by exposure to the UV rays can be suppressed more effectively.

The UV ray absorbing agent that can be used in the invention is preferably one having excellent absorbing capability of UV rays having a wavelength of 380 nm or less in respect of absorption of reflected light. In respect of transparency, one absorbing a small amount of visible rays having a wavelength of 400 nm or more is preferable. Specifically, a material having the maximum absorption wavelength of 360 nm or less corresponds thereto.

As the UV absorbing agent, oxybenzophenone compounds, benzotriazole compounds, salicylic acid ester compounds, benzophenone compounds, diphenyl acrylate compounds, cyanoacrylate compounds, diphenyl cyanoacrylate compounds, nickel complex salt compounds or the like can be given. Among these, diphenylcyanoacrylate compounds, cyanoacrylate compounds or diphenylacrylate compounds are preferable.

The amount ratio of an UV absorbing agent is preferably 0.1 to 30 parts by mass, more preferably 1 to 20 parts by weight, and further preferably 2 to 10 parts by mass relative to 100 parts by mass of the total of the component (A) and the component (B).

The content of an UV absorbing agent is preferably 0.1 part by mass or more in respect of excellent resolution and effective prevention of deterioration or disconnection of conductive fibers by exposure to UV rays. In respect of preventing light curing from being insufficient inside the composition when irradiated active rays are absorbed on the surface of the composition, the content is preferably 30 parts by mass or less.

As the method for incorporating a UV absorbing agent in a photosensitive layer, generally, a method in which the UV absorbing agent is internally added in advance to the photosensitive resin composition is used. The invention is not limited to internal addition. Other methods for incorporating the UV absorbing agent into the photosensitive layer include a method in which the UV absorbing agent is internally added to a conductive fiber solution or a method in which, after exposing the conductive film formed on the supporting film to a liquid containing the UV absorbing agent, drying is conducted again to form a conductive film. In order to incorporate the UV absorbing agent sufficiently and uniformly into the photosensitive resin composition to effectively prevent deterioration or disconnection of conductive fibers by exposure to the UV rays, a method in which the UV absorbing agent is internally added in advance to the photosensitive resin composition is most preferable. In this case, in order to suppress diffusion of an organic solvent in later steps, the amount of the remaining organic solvent after drying is preferably 2 mass % or less.

The photosensitive resin layer 3 is formed by applying to the supporting film 1 on which the conductive film 2 is formed a solution of the photosensitive resin composition obtained by dissolving the photosensitive resin composition in a solvent such as methanol, ethanol, acetone, methyl ethyl ketone, methyl cellosolve, ethyl cellosolve, toluene, N,N-dimethylformamide, propylene glycol monomethyl ether or the like, followed by drying. In this case, the amount of the remaining organic solvent in the photosensitive resin layer after drying is preferably 2 parts by mass or less in order to prevent diffusion of an organic solvent in the later steps.

Application of the photosensitive resin layer 3 can be conducted by a known method such as roll-coating, comma coating, gravure coating, air knife coating, die coating, bar coating and spray coating. The drying for removing an organic solvent can be conducted at 70 to 150° C. for 5 to 30 minutes by means of a hot air convection heater.

The thickness of the photosensitive resin layer 3 differs depending on the application. However, the thickness after drying is preferably 1 to 50 μm, more preferably 1 to 15 μm, with 1 to 10 μm being further preferable. If this thickness is less than 1 μm, application may tend to be difficult. If this thickness exceeds 50 μm, sensitivity becomes insufficient due to lowering in light transmittance, and as a result, light curability of the photosensitive resin layer to be transferred may tend to be lowered.

In the photosensitive conductive film used in the invention, it is preferred that a laminate of the conductive film 2 and the photosensitive resin layer 3 have a minimum light transmittance of 80% or more, more preferably 85% or more in a wavelength range of 450 to 650 nm when the total thickness of the both layers is assumed to be 1 to 10 μm. If the conductive film and the photosensitive resin layer satisfy these conditions, an increase in luminance is facilitated in a display panel or the like.

In the photosensitive conductive film used in the invention, a protective film can be laminated such that it contacts the surface opposite to the supporting film 1 side of the photosensitive resin layer 3.

As the protective film, a polymer film having heat resistance and resistance to a solvent such as a polyethylene terephthalate film, a polypropylene film and a polyethylene film can be used. Further, as the protective film, a polymer film similar to the above-mentioned supporting film may be used.

It is preferred that adhesive strength between the protective film and the photosensitive resin layer be smaller than adhesive strength between the photosensitive layer 4 and the supporting film 1 in order to allow the protective film to be peeled off easily from the photosensitive resin layer.

It is preferred that the protective film have fish eyes with a diameter of 80 μm or more in a quantity of 5 per $m^2$ or less. The "fish eye" means foreign matters, un-molten matters, oxidization-degraded matters or the like being incorporated into the film when the film is produced by subjecting materials to thermal melting, kneading, extrusion, biaxial stretching, casting or the like.

The thickness of the protective film is preferably 1 to 100 μm, more preferably 5 to 50 μm, further preferably 5 to 30 μm, with 15 to 30 μm being particularly preferable. If the thickness of the protective film is less than 1 μm, the protective film tends to be easily broken when laminating. If the thickness exceeds 100 μm, the cost tends to be higher.

<Method for Forming Conductive Pattern>

Hereinbelow, the method for producing a conductive pattern according to the invention will be explained with reference to the drawings.

Figure 4:
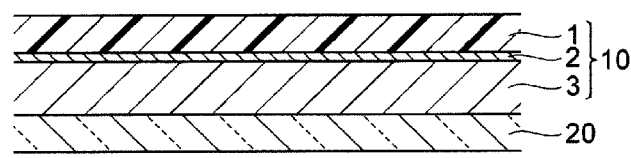
FIG. 4 is a schematic cross-sectional view for explaining one embodiment of a method for producing a conductive pattern using the photosensitive conductive film.
Figure 4:
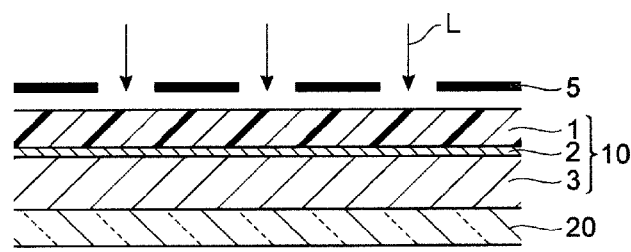
Figure 4:
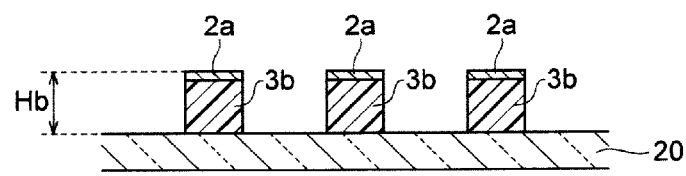

As shown in FIG. 4, a photosensitive resin layer 3 of a photosensitive conductive film 10 having a supporting film 1, a conductive film 2 and a photosensitive resin layer 3 is laminated on a substrate 20 (FIG. 4(a)). Then, the photosensitive resin layer 3 is irradiated with active rays L through a mask 5 in the shape of a pattern (FIG. 4(b)). An uncured part (unexposed part) is removed by development, whereby a conductive pattern (conductive film 2a) is formed (FIG. 4(c)). The conductive pattern obtained by the method mentioned above has a thickness of a resin cured layer 3b in addition to the thickness of the conductive film 2a.

These thicknesses result in step difference Hb between the conductive pattern and the substrate. If such step difference is large, smoothness required of a display or the like is hard to be obtained. If the step difference is large, a conductive pattern becomes easy to be recognized visually. Therefore, according to application, a method shown in FIG. 5 and a method shown in FIG. 4 can be used separately.

Figure 5:
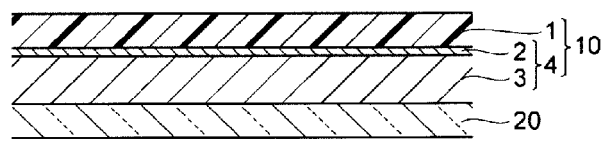
FIG. 5 is a schematic cross-sectional view for explaining another embodiment of a method for producing a conductive pattern using the photosensitive conductive film.
Figure 5:
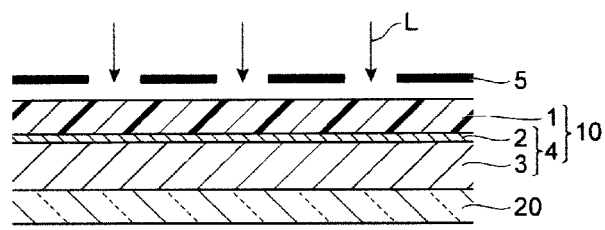
Figure 5:
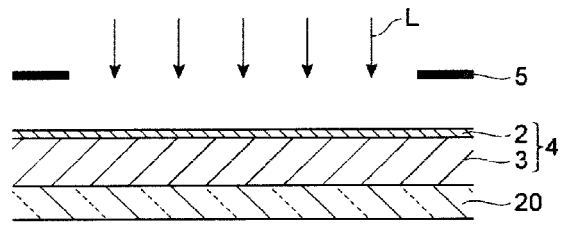
Figure 5:
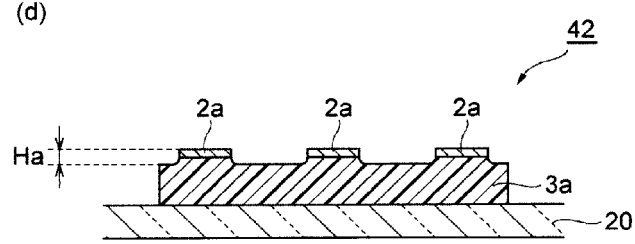

As shown in FIG. 5, after a first exposure step in which a prescribed part of the photosensitive layer 4 having the supporting film 1 is irradiated with active rays (FIG. 5(b)), it is preferred that a second exposure step (FIG. 5(c)) be provided. In the second exposure step, part or all of an exposed part and an unexposed part in the first exposure step is irradiated with active rays in the presence of oxygen after peeling the supporting film 1. The second exposure step is preferably conducted in the presence of oxygen, for example, in air. Further, it can be conducted under conditions where the oxygen concentration is increased.

In the development step in the method for forming a conductive pattern shown in FIG. 5, a surface part of the photosensitive resin layer 3 that is irradiated with light in the second exposure step and is not sufficiently cured is removed. Specifically, a surface part of the photosensitive resin layer 3 that is not sufficiently cured by a wet phenomenon, that is, a surface layer that includes a conductive film 2, is removed. As a result, on the substrate, a resin cured layer that does not have a conductive film is formed together with a conductive pattern, whereby a conductive pattern substrate 42 is obtained. As compared with a case where only a conductive pattern is provided on the substrate, a step difference Ha of the conductive pattern can be reduced.

The method for forming a conductive pattern of the invention comprises: a step of laminating a photosensitive conductive film of the invention such that the photosensitive resin layer is brought into close contact with the substrate; an exposure step in which a prescribed part of the photosensitive resin layer on the substrate is irradiated with active rays with the supporting film being attached; a step in which the supporting film is peeled off; and a development step in which a conductive pattern is formed by developing the irradiated photosensitive resin layer. By conducting these steps, a conductive pattern substrate provided with a conductive pattern obtained by patterning on the substrate is obtained.

As the substrate, a glass substrate, a plastic substrate such as polycarbonate or the like can be given. As for the substrate, one having a minimum transmittance of 80% or more in a wavelength region of 450 to 650 nm is preferable.

The laminating step is conducted by adhering, while heating, by pressure to the substrate the photosensitive resin layer side of the photosensitive conductive film after removing a protective film (if the protective film is present). Meanwhile, it is preferred that the lamination be conducted under reduced pressure in respect of adhesiveness and tracking property. Lamination of the photosensitive conductive film is preferably conducted in such a manner that the photosensitive resin layer and/or the substrate are heated to 70 to 130° C. and the adhesion by pressure is conducted at a pressure of about 0.1 to 1.0 MPa (about 1 to 10 kgf/cm$^2$). No specific restrictions are imposed on these conditions. Further, by heating the photosensitive resin layer to 70 to 130° C. as mentioned above, it is unnecessary to pre-heat the substrate in advance. The substrate can be subjected to a pre-heating treatment in order to further improve laminating property.

In the exposure step in which a prescribed part of the photosensitive resin layer on the substrate is irradiated with active rays, as the method for exposure, a method in which active rays are irradiated in the form of an image through a negative or positive mask pattern called artwork (mask exposure method) can be given. As the light source of active rays, a known light source can be used.

The amount of exposure differs depending on the apparatus used or the composition of the photosensitive resin composition. The amount of exposure is preferably 5 mJ/cm$^2$ to 1000 mJ/cm$^2$, more preferably 10 mJ/cm$^2$ to 200 mJ/cm$^2$. In respect of excellent light curability, the amount of exposure is preferably 10 mJ/cm$^2$ or more. In respect of resolution, the amount of exposure is 200 mJ/cm$^2$ or less.

The exposure step may be conducted in two stages. After conducting the first stage with the above-mentioned exposure amount, the second stage may be conducted with an exposure amount of 100 to 10,000 mJ/cm$^2$.

Wet development is conducted by a known method such as spraying, rocking immersion, brushing, scrapping or the like by using a developing liquid such as an aqueous alkaline solution, a water-based developing liquid, an organic solvent-based developing liquid or the like that corresponds to a photosensitive resin used.

As the developing liquid, one that is safe and stable and has good handling property (e.g. an alkaline aqueous solution) can be used. As the base of the alkaline aqueous solution, alkali hydroxides such as hydroxides of lithium, sodium or potassium; alkali carbonate such as a carbonate and a bicarbonate of lithium, sodium, potassium or ammonium; alkali metal phosphate such as potassium phosphate and sodium phosphate; alkali metal pyrophosphate such as sodium pyrophosphate and potassium pyrophosphate can be used.

As the alkaline aqueous solution used for development, an aqueous sodium carbonate solution, an aqueous potassium carbonate solution, an aqueous sodium hydroxide solution, an aqueous sodium tetraborate solution or the like are preferable. The concentration of the alkaline aqueous solution is normally 0.1 to 5 mass %.

Further, the pH of the alkaline aqueous solution is preferably in the range of 9 to 11. The temperature is adjusted according to the developability of the photosensitive resin layer. In the aqueous alkaline solution, a surface active agent, a de-foaming agent and a small amount of an organic solvent for accelerating development may be mixed.

Further, a water-based developing liquid composed of: water or an aqueous alkaline solution; and one or more organic solvents can be used. As the base contained in an alkaline aqueous solution, in addition to the above-mentioned base, borax or sodium methasilicate, ammonium tetramethylhydroxide, ethanolamine, ethylenediamine, diethylenetriamine, 2-amino-2-hydroxymethyl-1,3-propanediol, 1,3-diamino-2-propanol, morpholine or the like may be used.

As the organic solvent, acetone, ethyl acetate, alkoxy ethanol having alkoxy groups having 1 to 4 carbon atoms, ethyl alcohol, isopropyl alcohol, butyl alcohol, diethylene glycol monomethyl ether, diethylene glycol monoethyl ether, diethylene glycol monobutyl ether or the like can be given.

It is preferred that the water-based developing liquid have an organic solvent concentration of 2 to 90 mass %. The temperature thereof can be adjusted by developability. Further, it is preferred that the pH of the water-based developing solution be as small as possible in a range that development of a photoresist can be fully conducted. The pH is preferably 8 to 12, more preferably 9 to 10. Further, a small amount of a surfactant, a de-foaming agent or the like may be added to the water-based developing liquid.

As the organic solvent-based developing liquid, 1,1,1-trichloroethane, N-methylpyrrolidone, N,N-dimethylformamide, cyclohexanone, methylisobutylketone, γ-butyrolactone or the like can be given. In order to prevent ignition, it is preferable to add water in an amount range of 1 to 20 mass % to these organic solvents.

The above-mentioned developing liquids may be used in combination of two or more, according to need.

As the method for development, a dipping method, a battle method, a spray method, a brushing method, a slapping method or the like can be given. Among these methods, a high-pressure spray method is preferably in respect of improving resolution.

In the method for forming a conductive pattern of the invention, according to need, by conducting heating at about 60 to 250° C. or by exposure of about 0.2 to 10 J/cm$^2$ after development, a conductive pattern may be further cured.

According to the method for forming a conductive pattern of the invention as mentioned above, it is possible to form easily a transparent conductive pattern on a substrate such as glass and plastic without forming an etching resist such as in the case of an inorganic film like ITO.

The conductive pattern substrate of the invention can be obtained by the above-mentioned method for forming a conductive pattern. However, in respect of effective use as a transparent electrode, the surface resistivity of the conductive film or the conductive pattern is preferably 2000Ω/□ or less, more preferably 1000Ω/□ or less, particularly preferably 500Ω/□ or less. The surface resistivity can be adjusted by concentration or applied amount of a dispersion liquid of conductive fibers or an organic conductor.

It is preferred that the conductive pattern substrate of the invention have a minimum light transmittance of 80% or more, more preferably 85% or more, in a wavelength region of 450 to 650 nm.

<Touch Panel Sensor>

The touch panel sensor according to the invention is provided with the above-mentioned conductive pattern substrate.

Figure 6:
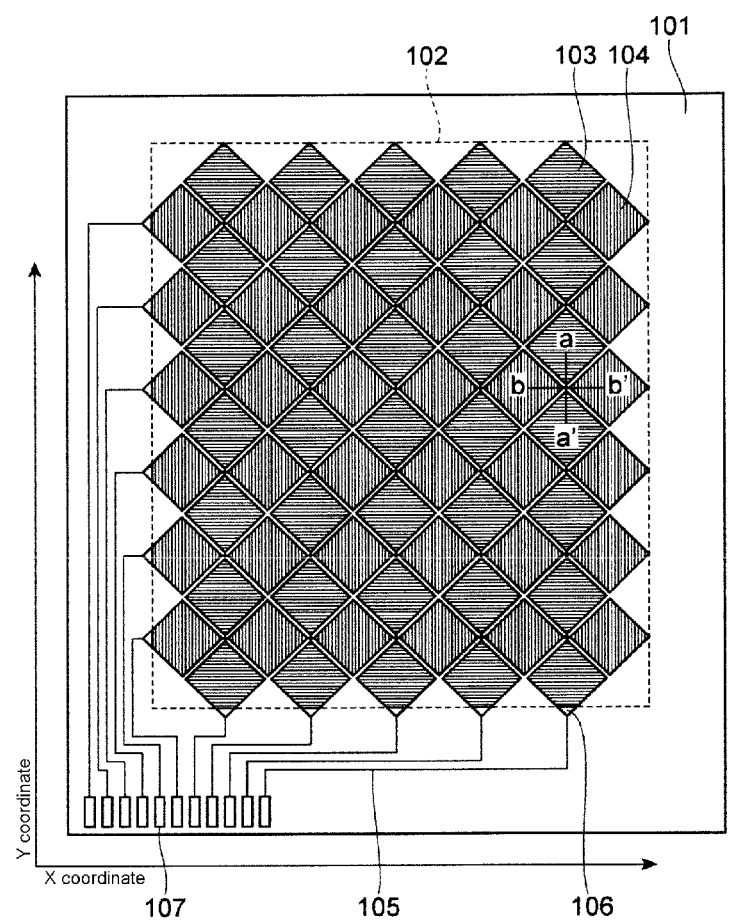
FIG. 6 is a schematic top view showing one example of an electrostatic capacitive touch panel sensor.

FIG. 6 is a schematic top view showing one example of the electrostatic capacitive touch panel sensor. In the touch panel sensor shown in FIG. 6, on one side of the transparent substrate 101, a touch screen 102 for detecting the touch position is provided. In this region, a transparent electrode 103 that detects a change in electrostatic capacity to form an X-axis coordinate and a transparent electrode 104 that detects a change in electrostatic capacity to form a Y-axis coordinate are provided. In these transparent electrodes 103 and 104, a lead wire 105 for connecting a driver device circuit that controls electric signals as a touch panel and a connecting electrode 106 that connects the lead wire 105 and the transparent electrodes 103 and 104 are arranged. Further, at the end opposite to the connecting electrode 106 of the lead wire 105, a connecting terminal 107 that connects the driver device circuit is arranged.

Figure 7:
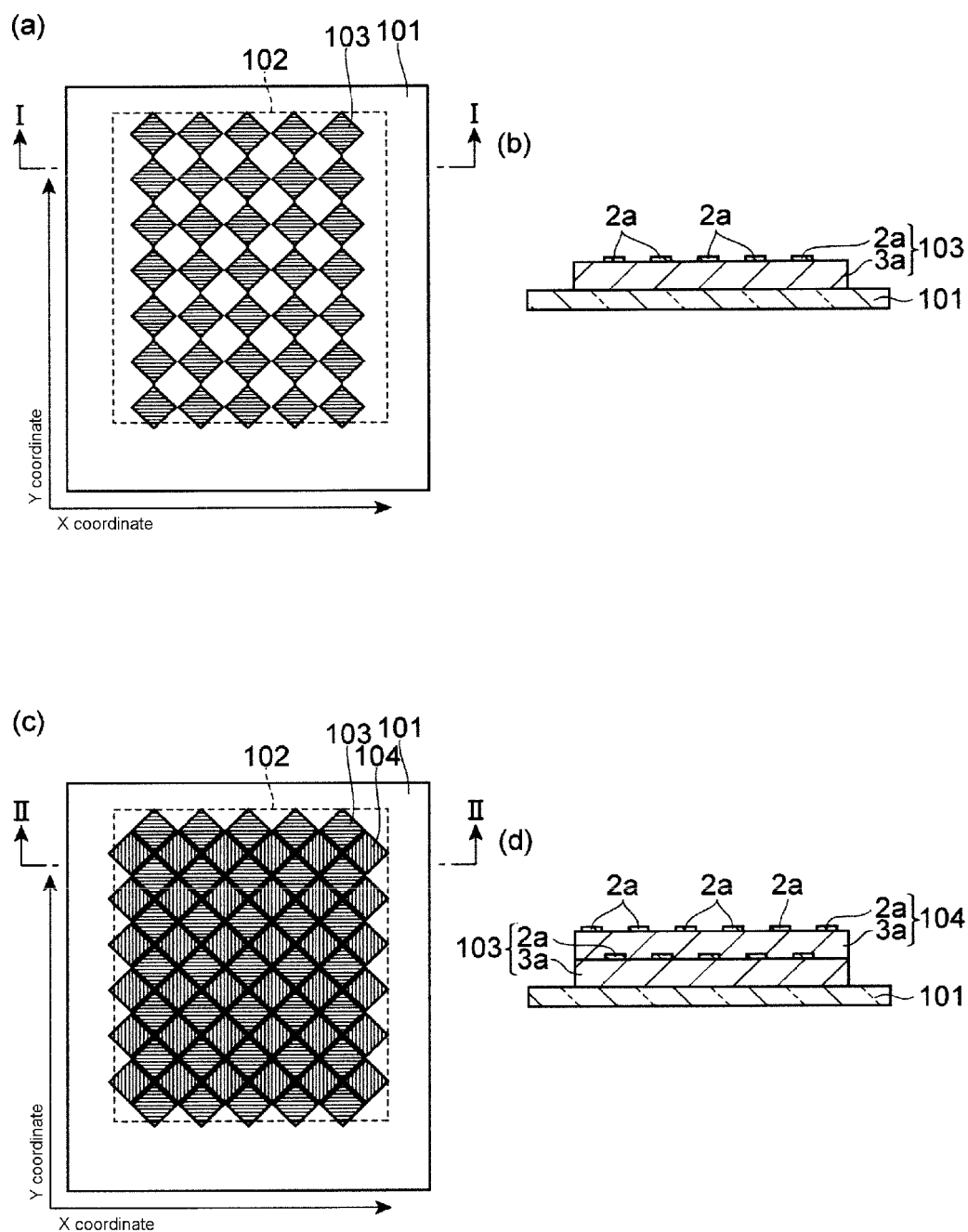
FIG. 7 is a schematic view for explaining one example of a method for producing the touch panel sensor shown in FIG. 6.

FIG. 7 is a schematic view showing one example of the method for producing a touch panel sensor shown in FIG. 6. In this production method, the transparent electrodes 103 and 104 are formed according to the method for forming a conductive pattern according to the invention.

First, as shown in FIG. 7(a), the transparent electrode 103 (X-position coordinate) is formed on the transparent electrode 101. Specifically, the photosensitive conductive film 10 is laminated (transferred) such that the photosensitive resin layer 3 is provided on the transparent substrate 101. The transferred photosensitive layer 4 (the conductive film 2 and the photosensitive resin layer 3) is irradiated with active rays in the form of a pattern to attain a desired shape through a light-shielding mask (first exposure step). Thereafter, the light-shielding mask is removed, and then the supporting film is peeled. Then, the photosensitive layer 4 is irradiated with active rays (second exposure step). After light exposure steps, by conducting development, the conductive film 2 is removed together with the photosensitive resin layer 3 that is insufficiently cured, whereby a conductive pattern 2a is formed. By this conductive pattern 2a, the transparent electrode 103 that detects the X-position coordinate is formed (FIG. 7(b)). FIG. 7(b) is a schematic cross-sectional view taken along the line I-I in FIG. 7(a). By forming the transparent electrode 103 by the method for forming the conductive pattern according to the invention, a transparent electrode 103 with a small step difference can be provided.

Subsequently, as shown in FIG. 7(c), a transparent electrode (Y-position coordinate) 104 is formed. On the substrate 101 having the transparent electrode 103 that is formed by the above-mentioned step, a new photosensitive conductive film 10 is laminated. By the operation similar to that mentioned above, the transparent electrode 104 that detects the Y-position coordinate is formed (FIG. 7(d)). FIG. 7(d) is a schematic cross-sectional view taken along the line II-II in FIG. 7(c). By forming the transparent electrode 104 by the method for forming a conductive pattern according to the invention, even in the case where the transparent electrode 104 is formed on the transparent electrode 103, a step difference can be sufficiently reduced and entrapment of bubbles is sufficiently reduced, whereby a touch panel sensor having excellent smoothness can be prepared.

Subsequently, on the surface of the transparent substrate 101, a lead wire 105 for connecting an external circuit and the connecting electrode 106 for connecting this lead wire with the transparent electrodes 103 and 104 is formed (not shown). In FIG. 7, the lead wire 105 and the connecting electrode 106 are formed after formation of the transparent electrodes 103 and 104. The lead wire 105 and the connecting electrode 106 may be formed simultaneously with the formation of each transparent electrode. The lead wire 105 can be formed by using a conductive paste material containing flake-like silver by a screen printing method simultaneously with the formation of the connecting electrode 106.

Figure 8:
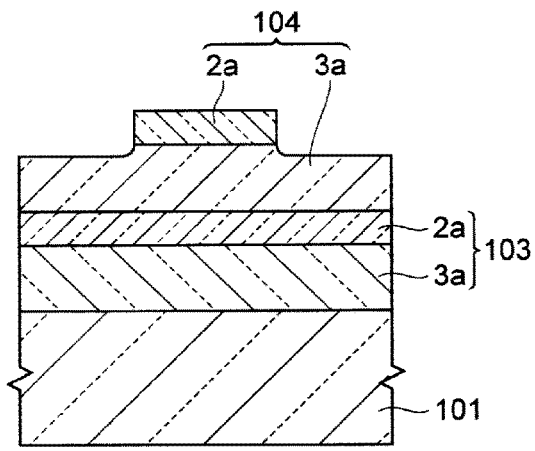
FIG. 8 is a partially cross-sectional view taken along the line a-a' shown in FIG. 6.
Figure 9:
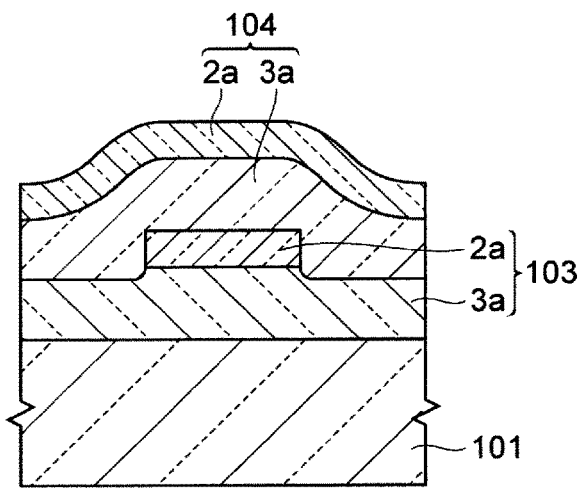
FIG. 9 is a partially cross-sectional view taken along the line b-b' shown in FIG. 6.

FIG. 8 and FIG. 9 are each a partial cross-sectional view taken along the lines a-a' and b-b' shown in FIG. 6. They indicate the intersection part of the transparent electrodes of the XY positional coordinates. As shown in FIG. 8 and FIG. 9, since the transparent electrode is formed by the method for forming the conductive pattern according to the invention, it is possible to obtain a touch panel sensor of which the step difference is small and has excellent smoothness.

EXAMPLES

Hereinbelow, the invention will be explained in detail with reference to the Examples, which should not be construed as limiting the scope of the invention.

Components used in the Examples and the Comparative Examples were as follows:

Component (B)
Trimethylolpropane triacrylate (TMPTA, manufactured by Nippon Kayaku Co., Ltd.)
Component (C)
1,2-octanedione, 1-[(4-phenylthio)phenyl-, 2-(O-benzoyloxime)] (OXE-01, manufactured by BASF Japan, Ltd.)
Component (D)
Titanium isopropoxybis(acetylacetonate) (TC-100, manufactured by Matsumoto Fine Chemical Co., Ltd.)
Titanium tetraacetylacetonate (TC-401, manufactured by Matsumoto Fine Chemical Co., Ltd.)
Zirconium tetraacetylacetonate (ZC-150, manufactured by Matsumoto Fine Chemical Co., Ltd.)
Aluminum trisacetylacetonate (Alumichelate A (W), manufactured by Kawaken Fine Chemicals Co., Ltd.)
Titanium oxide particles (ND139, titanium oxide particles dispersion liquid, manufactured by Tayca Corporation)
Component (E)
3-(phenylamino)propyltrimethoxysilane (KBM-573, Shin-Etsu Chemical Co., Ltd.)
2,4-diamino-6-phenyl-1,3,5-triazine (Benzoguanamine, manufactured by Nippon Shokubai Co., Ltd.)

(UV Absorbing Agent)
2-cyano-3,3-diphenylacrylic acid ethyl (SEESORB501, manufactured by Shipro Kasei Kabushiki Kaisha, Ltd.)
(Other Components)
Octamethylcyclotetrasiloxane (SH-30, manufactured by Dow Corning Toray Co., Ltd.) (Leveling agent)
Methyl ethyl ketone (manufactured by Tonen Chemical Corporation) (Solvent)

Production Example 1

Preparation of Silver Fiber Dispersion Liquid (Conductive Fiber Dispersion Liquid) (Coating Liquid for Forming Conductive Film)

[Preparation of Silver Fiber by Polyol Method]

In a three-neck flask having a capacity of 2,000 ml, 500 ml of ethylene glycol was put. In a nitrogen atmosphere, the ethylene glycol was heated to 160° C. in an oil bath while stirring by means of a magnetic stirrer. To the resultant, solution 1 (obtained by dissolving 2 mg of $PtCl_2$ in 50 ml of ethylene glycol) prepared separately was added dropwise. After the lapse of 4 to 5 minutes, solution 2 (obtained by dissolving 5 g of $AgNO_3$ in 300 ml of ethylene glycol) and solution 3 (polyvinylpyrrolidone, manufactured by Wako Pure Chemicals, weight-average molecular weight: 58,000) were added dropwise from respective dripping funnels in one minute. The reaction solution was stirred for 60 minutes at 160° C.

After allowing the reaction solution to stand until the temperature thereof became 30° C. or less, the solution was diluted 10 times with acetone. The diluted solution was then subjected to centrifugation at 2,000 rpm for 20 minutes, and the supernatant was removed by decantation. Acetone was added to a sediment. After stirring, centrifugation was conducted in the same manner as mentioned above, whereby acetone was removed by decantation. Thereafter, centrifugation was conducted twice with distilled water, thereby to obtain silver fibers. As a result of observation of the resulting silver fibers by means of an optical microscope, the fiber size (diameter) was 40 nm and the fiber length was 4 µm.

[Preparation of Silver Fiber Dispersion]

In pure water, the silver fibers obtained above were dispersed such that the concentration thereof became 0.2 mass %, and dodecyl-pentaethylene glycol was dispersed such that the concentration thereof became 0.1 mass %, whereby a silver fiber dispersion was obtained.

Production Example 2

Preparation of Binder Polymer Solution (A1)

In a flask provided with a stirrer, a reflux condenser, an inert gas introduction port and a thermometer, components (1) shown in Table 1 were placed. The resultant was heated to 80° C. in a nitrogen atmosphere. While keeping the reaction temperature at 80° C.±2° C., components (2) shown in Table 1 were uniformly added dropwise in 4 hours. After the dropwise addition of the components (2), stirring was conducted at 80° C.±2° C. for 6 hours, whereby a binder polymer solution (solid matter content: 50 mass %) (A1) having a weight-average molecular weight of 45,000 was obtained. The acid value of (A1) was 78 mgKOH/g. The glass transition temperature (Tg) was 60° C.

TABLE 1

| Materials | Amount added (part by mass) |
|---|---|
| (1) Propylene glycol monomethyl ether | 75 |
| Toluene | 49 |
| (2) Methacrylic acid | 12 |
| Methyl methacrylate | 58 |
| Ethyl acrylate | 30 |
| 2,2'-azobis(isobutyronitrile) | 1 |

The property of the thus prepared binder polymer solution was measured by the following method.
(1) Weight-Average Molecular Weight
The weight-average molecular weight (Mw) was obtained by measuring by the gel permeation chromatography (GPC), and converting by means of a calibration curve of standard polystyrene. The conditions of GPC are shown below.
Pump: Hitachi L-6000 (product name, manufactured by Hitachi Ltd.)
Column: Gelpack GL-R420, Gelpack GL-R430, Gelpack GL-R440 (product names, manufactured by Hitachi Chemical Co., Ltd.)
Eluent: Tetrahydrofuran
Measuring temperature: 40° C.
Flow rate: 2.05 mL/min
Detector: Hitachi L-3300 RI (product name, manufactured by Hitachi, Ltd.)
(2) Acid Value
The acid value was measured as follows. First, a binder polymer solution was heated at 130° C. for 1 hour, and an evaporated matter was removed, whereby a solid polymer was obtained. 1 g of the solid polymer was precisely weighed, and the precisely weighed polymer was put in an Erlenmeyer flask. 30 g of acetone was added, and the polymer was dissolved homogenously. Subsequently, an appropriate amount of phenol phthalene as the indicator was added to this solution. Titration was conducted by using a 0.1N KOH aqueous solution. The acid value was calculated by the following formula:

$$\text{Acid value}=10 \times Vf \times 56.1/(Wp \times I/100)$$

In the formula, Vf is the titration amount (mL) of the KOH aqueous solution, Wp is the mass (g) of the resin solution measured, and I is the amount ratio (mass %) of the unevaporated matter in the measured resin solution.
(3) Glass Transition Temperature (Tg)
The binder polymer solution prepared above was applied uniformly onto a polyethylene terephthalate film (product name "Purex A53" manufactured by Teijin Dupont Films), and then dried for 10 minutes by means of a heat convection drier of 90° C., whereby a film having a thickness of 40 µm after drying was formed. Subsequently, by using an exposure machine having a high-pressure mercury lamp (product name: "EXM-1201", manufactured by ORC Manufacturing Co., Ltd.), the film was irradiated such that the irradiation energy amount became 400 mJ/cm² (measured value at i rays (wavelength: 365 nm)). The irradiated film was heated on a hot plate at 65° C. for 2 minutes, and then at 95° C. for 8 minutes. After drying at 180° C. for 60 minutes by means of a heat convection dryer, the film was peeled off from the polyethylene terephthalate film. The peeled film was heated at a heating rate of 5° C./min by means of TMA/SS6000 by means of Seiko Instruments Inc., and the thermal expansion ratio of the cured film was measured. The inflection point obtained from this curve was obtained as a glass transition temperature (Tg).

Example 1

Preparation of Photosensitive Conductive Film V1

[Preparation of Conductive Film W1 (Conductive Film of Photosensitive Conductive Film)]

The silver fiber dispersion obtained in Production Example 1 was uniformly applied onto a 50 μm-thick polyethylene terephthalate film (PET film manufactured by Teijin Limited, product name "G2-50") at a rate of 25 g/m$^2$, and then dried for 3 minutes by means of a heat convection drier of 100° C., whereby a conductive film W1 was formed. The film thickness after drying of the conductive film was 0.1 μm.

[Preparation of Solution X1 of Photosensitive Resin Composition]

The materials shown in Table 2 were mixed for 15 minutes by means of a stirrer in amount ratios (part by mass) shown in Table 2, whereby a solution X1 of the photosensitive resin composition was prepared.

In Table 2, as for the amounts of the component (A) and the component (D), the mass of the solid matters alone is indicated.

[Preparation of Photosensitive Conductive Film V1]

The solution X1 of the photosensitive resin composition was uniformly applied onto the conductive film W1, and then dried for 10 minutes by means of a hot convection drier of 100° C. Thereafter, the photosensitive resin layer was covered with a polyethylene film (product name "NF-13", manufactured by Tamapoly Co., Ltd.), whereby a photosensitive conductive film V1 was obtained. The thickness after drying of the photosensitive resin layer was 5 μm.

<Evaluation of Photosensitive Conductive Film V1>

[Measurement of Light Transmittance of Photosensitive Conductive Film V1]

While peeling the polyethylene film of the resulting photosensitive conductive film V1, on a glass substrate having a thickness of 1 mm, lamination was conducted such that the photosensitive resin layer was brought into contact with the substrate by means of a laminator (product name HLM-3000 manufactured by Hitachi Chemical Co., Ltd.) at a roller temperature of 110° C., a substrate feeding rate of 1 m/min, a pressure for adhesion (cylinder pressure) of 4×10$^5$ Pa (since a substrate having a thickness of 1 mm, a length of 10 cm and a width of 10 cm was used, the line pressure at this time was 9.8×10$^3$ N/m), whereby a substrate on which the photosensitive conductive film V1 including a supporting film was stacked on the glass substrate was prepared.

Subsequently, by means of a parallel light exposure machine (EXM1201 manufactured by ORC Manufacturing Co., Ltd.), the photosensitive conductive film on the glass substrate was irradiated with UV rays from the side of the supporting film at an exposure amount of 5×10$^2$ J/m$^2$ (measured value at i rays (wavelength: 365 nm)). The supporting film was then removed, whereby a sample for measuring the transmittance of the photosensitive resin layer and the conductive film (photosensitive layer) (film thickness 5.0 μm) was obtained.

Then, the visible light transmittance was measured at a measurement wavelength region of 400 to 700 nm by means of a UV-visible spectrophotometer (U-3310: manufactured by Hitachi High-Tech Fielding Corp.).

The transmittance of the resulting sample was 92% at a wavelength of 700 nm, 91% at a wavelength of 550 nm and 87% at a wavelength of 400 nm. The excellent transmittance was ensured.

[Test on Light Resistance of the Photosensitive Conductive Film V1 with an Out-Cell Type Configuration]

While peeling the polyethylene film of the resulting photosensitive conductive film V1, on a polyethylene terephthalate film (PET film manufactured by Toyobo Co., Ltd., product name A4300, length 6 cm×width 6 cm, thickness 125 μm), lamination was conducted such that the photosensitive resin layer was brought into contact with the film by means of a laminator (product name HLM-3000 manufactured by Hitachi Chemical Co., Ltd.) at a roller temperature of 110° C., a substrate feeding rate of 1 m/min, a pressure for adhesion (cylinder pressure) of 4×10$^5$ Pa, whereby a substrate wherein the photosensitive conductive film V1 including a supporting film was stacked on the PET film substrate was prepared.

Subsequently, by means of a parallel light exposure machine (EXM1201 manufactured by ORC Manufacturing Co., Ltd.), the photosensitive conductive film V1 on the PET substrate was irradiated with UV rays from the side of the supporting film (from above the conductive film of the photosensitive conductive film) at an exposure amount of 5×10$^2$ J/m$^2$ (measured value at i rays). The supporting film was then removed. Further, from above the conductive film, irradiation was conducted with UV rays at an exposure amount of 1×10$^4$ J/m$^2$ (measured value at i rays), and a cured film (film thickness: 5.0 μm) of the photosensitive layer was formed on the entire surface of the PET film, whereby a laminate was obtained. The sheet resistance of the resulting laminate was measured by means of a non-contact type resistance measurement device (EC-80P, manufactured by Napcon Corporation), and the sheet resistance was found to be 200±20Ω/□.

Subsequently, on the resulting laminate, after peeling the separator on one side of OCA (product name TE-5000H, manufactured by Hitachi Chemical Co., Ltd., film thickness 100 μm), the OCA was laminated such that the cured film (including the conductive film) of the laminate was brought into contact with the adhesive layer of the OCA by means of a laminator (product name HLM-3000, manufactured by Hitachi Chemical Co., Ltd.) at a roll temperature of room temperature (20 to 30° C.), a substrate feeding rate of 1 m/min and a pressure for adhesion (cylinder pressure) of 4×10$^5$ Pa, whereby a laminate in which the cured film (including a supporting film) and the OCA were stacked on the PET film substrate was prepared.

Subsequently, after peeling the separator of the OCA, the resulting laminate (PET film/curd film/OCA) was laminated by means of a laminator (product name HLM-3000, manufactured by Hitachi Chemical Co., Ltd.) on a glass substrate such that the adhesive layer of the OCA was brought into contact with the glass substrate (length 6 cm×width 6 cm, thickness 1 mm) at a roll temperature of room temperature (20 to 30° C.), a substrate feeding rate of 1 m/min and a pressure for adhesion (cylinder pressure) of 4×10$^5$ Pa, whereby a laminate wherein the cured film, the OCA and the glass were laminated on the PET film substrate was prepared. The configuration of this laminate (PET film/cured film/OCA/glass) will be referred to as an out-cell type laminate.

Subsequently, as for the resulting out-cell type laminate (PET film/cured film/OCA/glass), a black tape (vinyl tape VT-50 black, manufactured by Nichiban Co., Ltd.) was attached by hands to the glass surface side such that it covered one third of the entire surface (length 6 cm×width 6 cm), whereby a sample for light resistance (weatherability)

test was obtained. The plan view and the cross-sectional view of the sample are respectively shown in FIG. 10 and FIG. 11.

Figure 10:
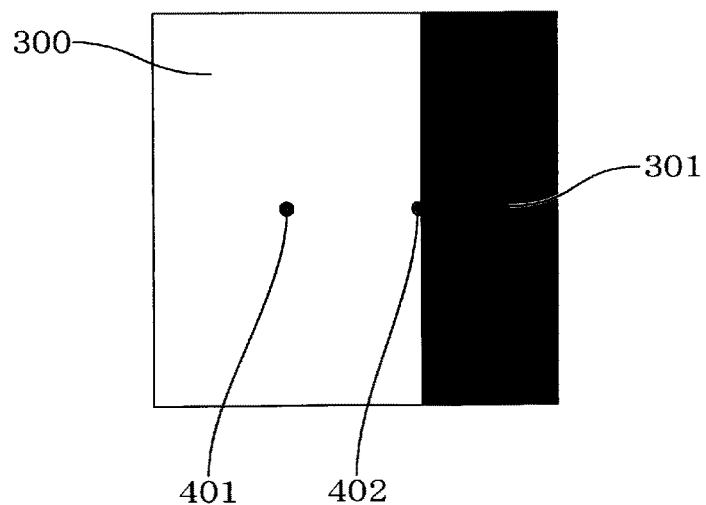
FIG. 10 is a plan view of an out-cell type sample for the test of light resistance prepared in Example 1.
Figure 11:
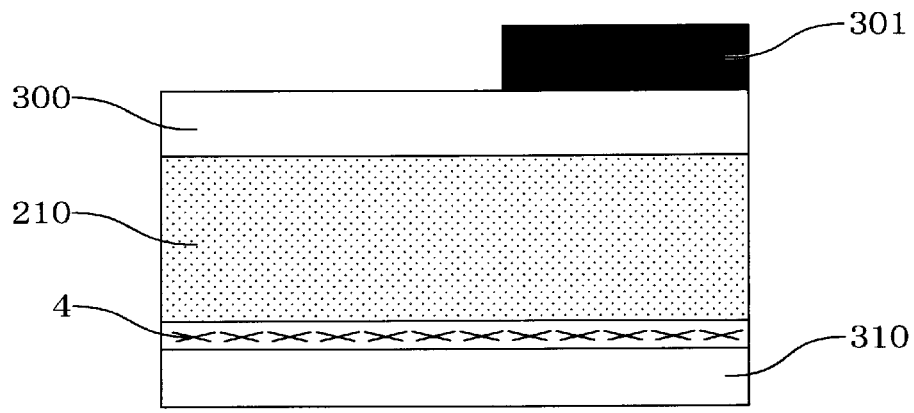
FIG. 11 is a cross-sectional view of an out-cell type sample for the test of light resistance prepared in Example 1.

In FIG. 10 and FIG. 11, 300 is the glass substrate, 301 is the black tape, 401 is a sheet resistance measurement part of the view area, 402 is a sheet resistance measurement part of the end part of the shield part, 310 is the PET film, 4 is the cured film and 210 is the OCA.

The sheet resistance of the resulting light resistance test sample was evaluated by means of a non-contact resistance meter (EC-80P manufactured by Napcon Corporation) from the PET film side of the light resistance test sample. The sheet resistance was measured at two positions; i.e. a view area 401 (a region where no black tape was attached) and an end part of a shield part 402 (a boundary part between a part where the black tape was attached and a part where the black tape was not attached) (see FIG. 10). The sheet resistance was 200±20Ω at both the view area and the shield part. These sheet resistances were taken as initial values (R0) before the light resistance test.

Then, the light resistance test sample was irradiated with light emitted from a Xenon lamp by using a light resistance testing machine (SUNTEST XLS+, manufactured by Atlas Material Testing Technology GmbH). The testing conditions are as follows: black panel temperature of 60° C., irradiation intensity of 60 W/m$^2$ (integrated value of spectral irradiance at a wavelength of 300 nm to 400 nm), temperature of a testing chamber of 45° C., humidity of 15% RH and testing time of 300 hours. The irradiance at a wavelength of light emitted from a xenon lamp of 365 nm under the above-mentioned testing conditions was 0.8 W/m$^2$. Light from the xenon lamp was emitted from the side of the light resistance test sample where the black tape was attached. After the light resistance test, the sample was allowed to stand at room temperature for one hour. Then, the sheet resistances of the view area and the shield part were measured. The sheet resistances were taken as the sheet resistances after the light resistance test (R1).

The light resistance was evaluated according to the following criteria based on the sheet resistances R0 and R1 before and after the light resistance test. Here, the ratio of R0 and R1 (R1/R0) was taken as Rr. As mentioned below, when the ratio of increase in resistance was 20% or less, the light resistance was excellent ⊚ or good ○.
⊚; Rr≤1.1
○; 1.1<Rr≤1.2
Δ; 1.2<Rr≤1.5
x; 1.5<Rr≤2
xx; Rr>2

As a result of examination, light resistance at the view area was evaluated to be excellent and that at the shield part was evaluated to be excellent.
[Evaluation of Touch Panel Driving of Photosensitive Conductive Film V1 in an Out-Cell Type Configuration]

While peeling the polyethylene film of the resulting photosensitive conductive film V1, on a polyethylene terephthalate film (PET film manufactured by Toyobo Co., Ltd. product name A4300, length 15 cm×width 15 cm, thickness 125 μm), lamination was conducted such that the photosensitive resin layer was brought into contact with the film by means of a laminator (product name HLM-3000 manufactured by Hitachi Chemical Co., Ltd.) at a roller temperature of 110° C., a substrate feeding rate of 1 m/min, a pressure by adhesion (cylinder pressure) of 4×10$^5$ Pa, whereby a substrate wherein the photosensitive conductive film V1 including a supporting film was stacked on the PET film substrate was prepared.

After the lamination, the PET film substrate was cooled. When the substrate temperature became room temperature (23° C. to 25° C.), on the PET film surface as the supporting film, an artwork having a wiring pattern of a line width/space width of 1500/3600 μm and a length of 100 mm was brought into close contact therewith. Then, on the photosensitive conductive film V1 on the PET substrate, by means of a parallel light exposure machine (EXM1201 manufactured by ORC Manufacturing Co., Ltd.), the photosensitive conductive film on the glass substrate was irradiated with UV rays at an exposure amount of 5×10$^2$ J/m$^2$ (measured value at i rays) from the side of the supporting film (from above the photoconductive film of the photosensitive conductive film).

After the exposure, the substrate was allowed to stand at room temperature (23° C. to 25° C.) for 15 minutes. Then, the supporting film was removed, and development was conducted by spraying an aqueous 1 mass % sodium carbonate solution at 30° C. for 30 seconds. By the development, a conductive pattern having a line width/space width of about 1500/3600 μm and a length of 10 cm was formed on the PET film substrate.

Figure 14:
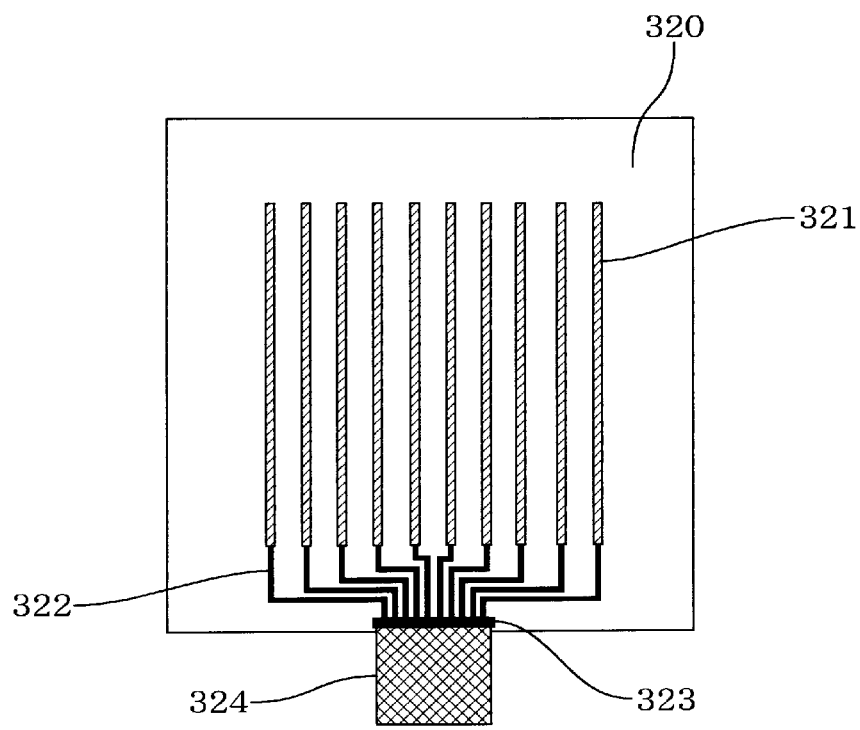
FIG. 14 is a plan view of a PET film substrate having a conductive pattern that is connected with FPC for evaluating driving of a touch panel prepared in Example 1.

Subsequently, as shown in FIG. 14, the conductive pattern 321 on the PET film substrate 320 and FPC324 were connected. Specifically, on the PET film substrate 320 having the resulting conductive pattern 321, by a known method, silver paste (DW-117H-41, manufactured by Toyobo Co., Ltd.) was printed, and then heated in a box-shaped drier at 120° C. for 30 minutes, thereby allowing the silver paste to be cured. Thereafter, by a known method, FPC (flexible printing circuit) 324 and silver paste lead wire 322 were connected with ACF (anisotropic conductive film) and each single conductive pattern was connected with FPC 324 through the silver paste lead wire 322 and the ACF 323. By the method mentioned above, two PET film substrates 320 each having a conductive pattern connected with FPC were prepared.

For the resulting two PET film substrates, the conductive patterns were respectively taken as the X-axis electrode 325 and the Y-axis electrode 326, and were stacked through OCA (product name DA-5000H, manufactured by Hitachi Chemical Co., Ltd., film thickness: 100 μm) such that the X-axis electrode and the Y-axis electrode were orthogonally crossed.

Figure 15:
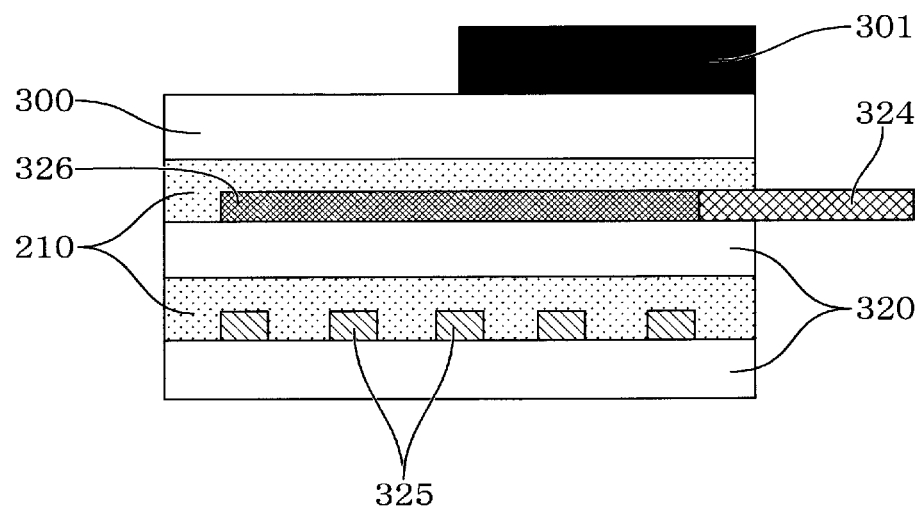
FIG. 15 is a cross-sectional view of an out-cell type sample for evaluating driving of a touch panel prepared in Example 1.

Subsequently, as shown in FIG. 15, for the obtained laminate (X-axis electrode PET films 320, 325/OCA210/Y-axis electrode PET films 320 and 326), OCA210 was attached to the Y-axis electrode side, and further, the glass 300 (length 15 cm×width 15 cm, thickness 1 mm) was laminated, thereby to prepare a laminate in which the X-axis electrode PET film and the Y-axis electrode PET film were stacked through OCA. This laminate (X-axis electrode PET film/OCA/Y-axis electrode PET film/OCA/glass) is called as an out-cell type touch panel.

Figure 16:
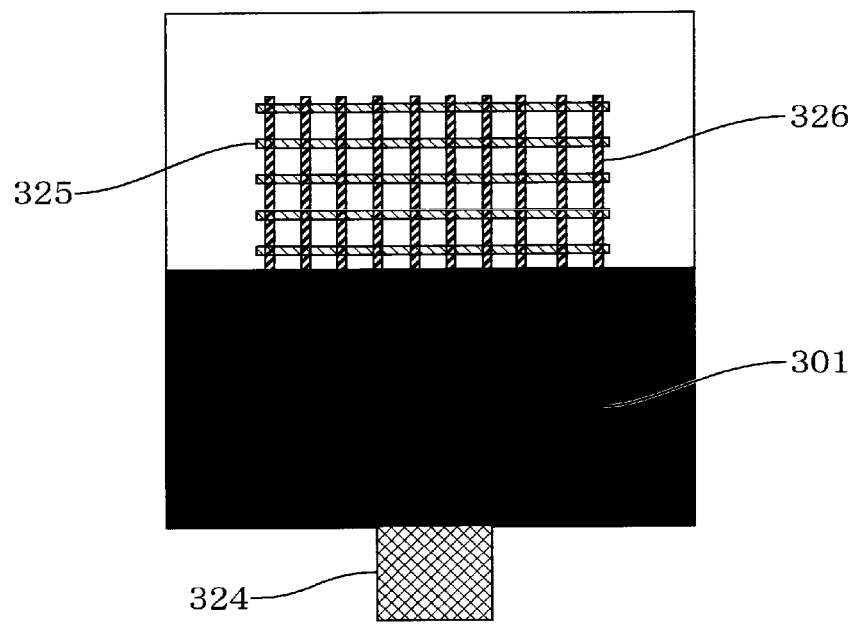
FIG. 16 is a plan view of an out-cell type sample for evaluating driving of a touch panel prepared in Example 1.

Subsequently, as for the resulting out-cell type touch panel, a black tape 301 (vinyl tape VT-50 black, manufactured by Nichiban Co., Ltd.) was attached by hands to the glass surface side such that it covered half of the entire surface (length 15 cm×width 15 cm). As shown in FIG. 16, the black tape was attached such that it covered the side where the silver paste lead wire was formed in the conductive pattern of the Y-axis electrode PET film substrate. By using the out-cell type touch panel having the black tape, evaluation on driving was conducted. FIG. 15 and FIG. 16 are respectively a cross-sectional view and a plan view of the sample.

Figure 17:
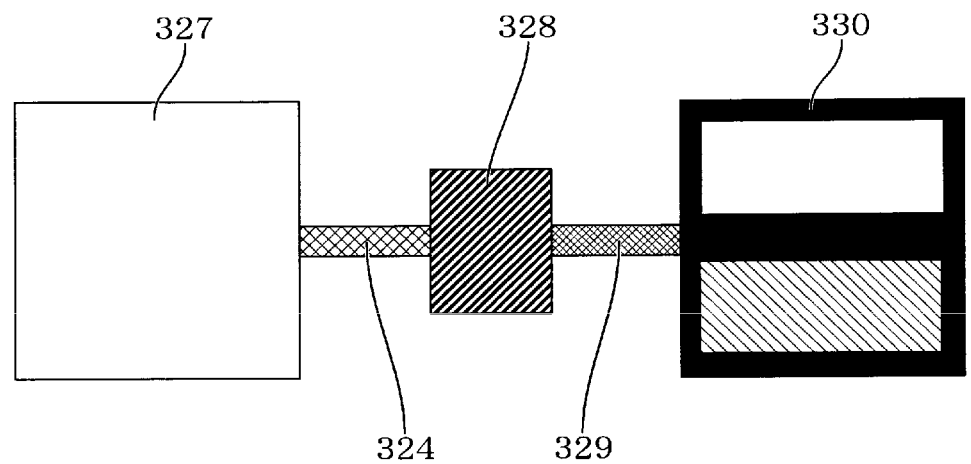
FIG. 17 is a view showing a device for evaluating driving of a touch panel prepared in Example 1.

As shown in FIG. 17, the touch panel 327 for evaluating driving was connected through FPC324 with a commercially available controller IC substrate 328 (EXC7236, manufactured by DMC Co., Ltd.). Thereafter, through USB329 attached, the controller IC substrate was connected with a PC 330 with built-in Windows (registered trademark) 7. The glass surface of the touch panel for evaluating driving to which the black tape was not attached was touched by an index finger to examine whether the mouse cursor on the PC screen was reacted. It was revealed that the mouse cursor was reacted in accordance with the touch by the finger, confirming that the touch panel was driven without problems.

Subsequently, by using a light resistance testing machine (SUNTEST XLS+, manufactured by Atlas Material Testing Technology GmbH), the touch panel 327 for evaluating driving was irradiated with light from a Xenon lamp from the side to which the black tape was attached. The testing conditions were as follows. Black panel temperature: 60° C., the irradiance (integrated value of spectral irradiance at a wavelength of 300 to 400 nm): 60 W/m$^2$, the temperature of a testing chamber: 45° C., humidity: 15% RH, and testing time: 300 hours. The irradiance of light emitted from the xenon lamp under the above-mentioned conditions was 0.8 W/m$^2$. After the light resistance test, the touch panel 327 for evaluating driving was allowed to stand at room temperature for 1 hour. Then, the touch panel 327 was connected with the PC330 through the controller IC328 to evaluate whether the touch panel could be driven. It was confirmed that the touch panel was driven without problems.

In the invention, the touch panel that could be driven without problems after the light resistance test was evaluated as good (○), and the touch panel that was not driven after the light resistance test, specifically, the touch panel in which the mouse cursor of the PC was not reacted and the touch panel was not driven even if the glass surface of the touch panel was touched by the finger, was evaluated as poor (x).

Examples 2 to 7

Photosensitive conductive films were prepared and evaluated for light resistance in the same manner as in Example 1, except that the solution (X) of the photosensitive resin compositions shown in Table 2 were used. The results are shown in Table 2.

Examples 8 to 10

Photosensitive conductive films were prepared and evaluated for light resistance in the same manner as in Example 1, except that the conductive film W2 or W3 was used instead of the conductive film W1 and the solution (X) of the photosensitive resin compositions shown in Table 2 were used. The results are shown in Table 2.

The conductive films W2 and W3 were prepared by the following method.
[Preparation of Conductive Film (Conductive Film of Photosensitive Conductive Film) W2]

The silver fiber dispersion obtained in Production Example 1 was uniformly applied onto a polyethylene terephthalate film (PET film, product name "G2-50" manufactured by Teijin Limited, film thickness: 50 µm) at a rate of 25 g/m$^2$. This coating was dried for 3 minutes by means of a heat convection drier of 100° C. to form a conductive film. This conductive film was immersed for 3 minutes in an aqueous titanium complex solution (1 mass % titanium triethanol aminate aqueous solution, product name TC-400, manufactured by Matsumoto Fine Chemical Co., Ltd., used after diluting TC-400 with pure water) and then dried for 3 minutes by means of a heat convection drier of 100° C., whereby a conductive film W2 was formed. The film thickness of the conductive film after the drying was 0.1 µm.
[Preparation of Conductive Film (Conductive Film of Photosensitive Conductive Film) W3]

To the silver fiber dispersion obtained in Production Example 1, titanium triethanol aminate (product name TC-400, manufactured by Matsumoto Fine Chemical Co., Ltd.) was added such that the content of the titanium triethanol amine became 3 parts by mass relative to 100 parts by mass of the silver fibers, followed by sufficient stirring. Thereafter, the dispersion was uniformly applied onto a polyethylene terephthalate film (PET film, product name "G2-50" manufactured by Teijin Limited, film thickness: 50 µm) at a rate of 25 g/m$^2$, and then dried for 3 minutes by means of a heat convection drier of 100° C., whereby a conductive film W3 was formed. The film thickness of the conductive film after the drying was 0.1 µm.

Examples 11 and 12

The light resistance was evaluated in the same manner as in Example 1, except that the configuration of the sample for evaluating light resistance was changed to a cover-glass integrated type (glass/cured layer/OCA/PET film) and that the solution (X) of the photosensitive resin compositions shown in Table 2 were used. The results are shown in Table 2. The cover-glass integrated type sample (glass/cured layer/OCA/PET film) was prepared as follows.
[Method for Preparing Sample (Cover-Glass Integrated Type) for Light Resistance Test of Photosensitive Conductive Film V1]

A cover-glass integrated type laminate of glass/cured layer/OCA/PET film was obtained in the same manner as in the case of the out-cell type laminate, except that lamination was conducted on a glass substrate (length 6 cm×width 6 cm, thickness 1 mm) while peeling off the polyethylene film of the photosensitive conductive film V1, and that the obtained glass/cured film/OCA laminate was laminated on a PET film (manufactured by Toyobo Co., Ltd. product name A4300, length 6 cm×width 6 cm, thickness 125 µm).

The sheet resistance of the laminate formed of the glass substrate and the cured film was 200±20 Ω/□cm$^2$.

Subsequently, for the resulting cover-glass integrated type laminate (glass/cured film/OCA/PET film), a black tape (vinyl tape VT-50 black, manufactured by Nichiban Co., Ltd.) was attached by hands to the glass side such that it covered one third of the entire surface (length 6 cm×width 6 cm), whereby a sample for light resistance test was obtained. The plan view and the cross-sectional view of the sample are respectively shown in FIG. 12 and FIG. 13.

Figure 12:
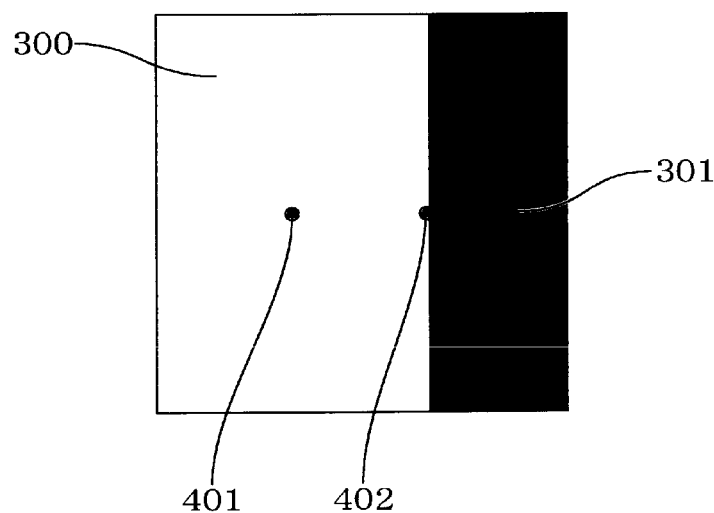
FIG. 12 is a plan view of a cover glass-integrated type sample for the test of light resistance prepared in Examples 11 and 12.
Figure 13:
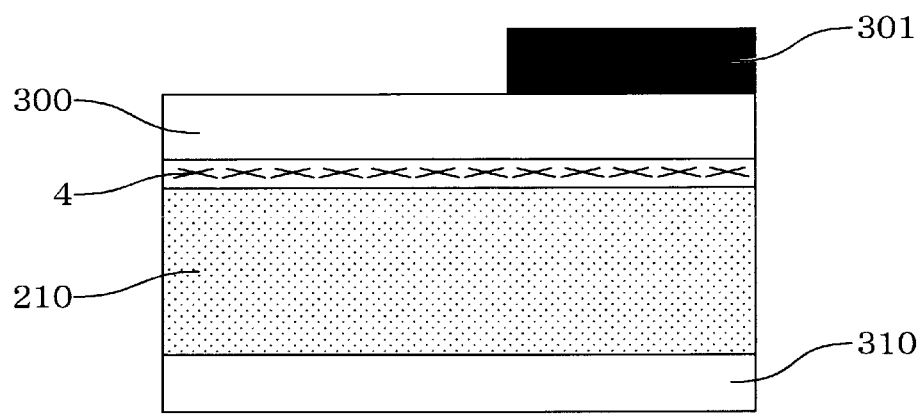
FIG. 13 is a cross-sectional view of a cover glass-integrated type sample for the test of light resistance prepared in Examples 11 and 12.

The numerals in FIG. 12 and FIG. 13 are the same as those in FIG. 10 and FIG. 11.
[Evaluation of Touch Panel Driving of Photosensitive Conductive Film V1 in a Cover-Glass Integrated Type Configuration]

Figure 18:
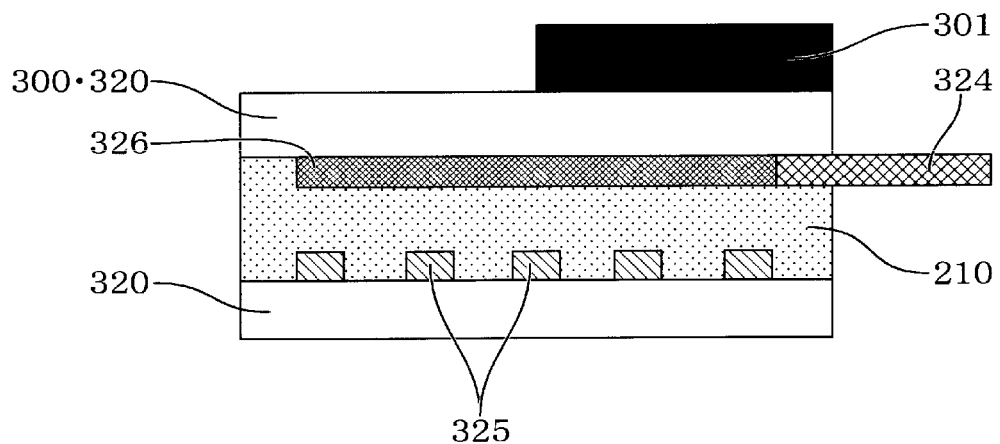
FIG. 18 is a cross-sectional view of a cover glass-integrated type sample for evaluating driving of a touch panel prepared in Examples 11 and 12.
Figure 19:
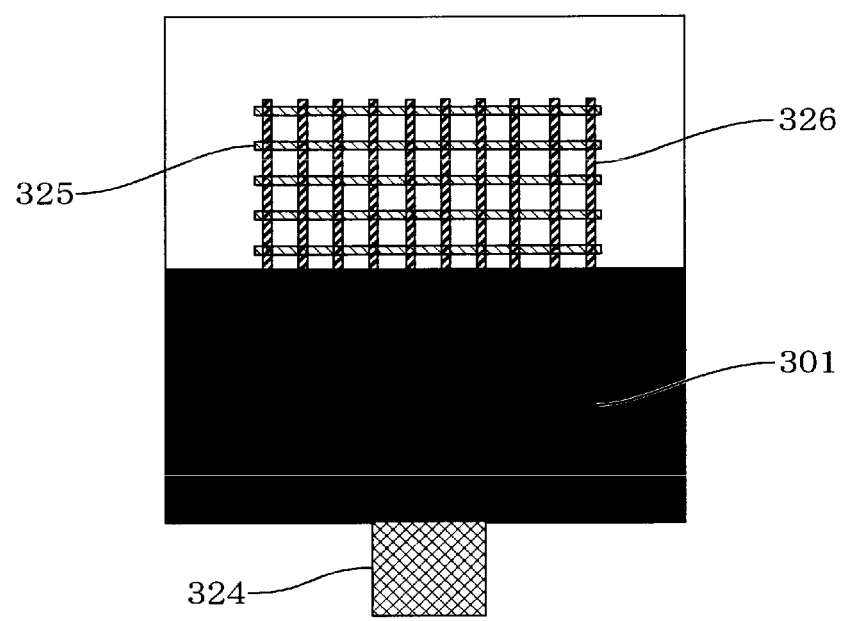
FIG. 19 is a plan view of a cover glass-integrated type sample for evaluating driving of a touch panel prepared in Examples 11 and 12.

FIG. 18 and FIG. 19 are respectively a cross-sectional view and a plan view of the sample for evaluation.

A laminate was prepared in the same manner as in the production of the out-cell type laminate, except that, lamination was conducted on a glass substrate (length 15 cm×width 15 cm, thickness 1 mm) while peeling off the polyethylene film of the photosensitive conductive film V1, and that the resulting X-axis electrode glass substrates 320 and 325 and the Y-axis electrode glass substrates 320 and 326 were stacked in a configuration of the X-axis electrode glass substrate/OCA210/Y-axis electrode glass substrate. This laminate (X-axis electrode glass substrate/OCA/Y-axis electrode glass substrate) is called a cover-glass integrated type touch panel.

Subsequently, for the resulting cover-glass integrated touch panel, a black tape 301 (vinyl tape VT-50 black, manufactured by Nichiban Co., Ltd.) was attached by hands to the Y-axis electrode glass surface side such that it covered half of the entire surface (length 15 cm×width 15 cm). The black tape was attached such that it covered the side where the silver paste lead wire was formed in the conductive pattern of the Y-axis electrode PET film substrate. By using the cover-glass integrated type touch panel having the black tape as prepared above, driving was evaluated in the same manner as in the evaluation of the out-cell type touch panel.

Comparative Examples 1 to 4

Photosensitive conductive films were prepared and evaluated for light resistance in the same manner as in Example 1, except that the solution (X) of the photosensitive resin compositions shown in Table 2 were used. The results are shown in Table 2.

Comparative Examples 5 and 6

Light resistance was evaluated in the same manner as in Example 1, except that the configuration of the sample of light resistance evaluation was changed to a cover-glass integrated type (glass/cured layer/OCA/PET film) and that the solution (X) of the photosensitive resin compositions were used. The results are shown in Table 2.

TABLE 2

| | | Item | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|---|---|
| Photosensitive resin composition solution (X) | (A) | (A1) | 60 | 60 | 60 | 60 | 60 | 60 | 60 | 60 | 60 | 60 | 60 |
| | (B) | Trimethylolpropane triacrylate | 40 | 40 | 40 | 40 | 40 | 40 | 40 | 40 | 40 | 40 | 40 |
| | (C) | 1,2-octanediaone, 1-[4-(phenythio)phenyl-, 2-(O-benzolyloxime)] | 1.5 | 1.5 | 1.5 | 1.5 | 1.5 | 1.5 | 1.5 | 1.5 | 1.5 | 1.5 | 1.5 |
| | (D) | Titanium diisopropoxy-bis (acetylacetonate) | 3 | — | — | — | — | — | 3 | — | — | — | 3 |
| | | Titanium tetraacetylacetonate | — | 3 | — | — | — | — | — | — | — | — | — |
| | | Zirconium tetraacetylacetonate | — | — | 3 | — | — | — | — | 3 | — | — | — |
| | | Aluminum trisacetylacetonate | — | — | — | 3 | — | — | — | — | — | — | — |
| | | Titanium oxide particles | — | — | — | — | 3 | — | — | — | — | — | — |
| | (E) | 3-(phenylamino)propyltri-methoxysilane | — | — | — | — | — | — | — | 5 | — | — | — |
| | | 2,4-diamino-6-phenyl-1,3,5-triazine | — | — | — | — | — | — | — | — | — | — | — |
| | UV absorbing agent | Ethyl 2-cyano-3,3-diphenyl-acrylate | — | — | — | — | — | — | 3 | — | — | 3 | — |
| | Others | Octamethylcyclotetrasiloxane | 0.1 | 0.1 | 0.1 | 0.1 | 0.1 | 0.1 | 0.1 | 0.1 | 0.1 | 0.1 | 0.1 |
| | | Methyl ethyl ketone | 100 | 100 | 100 | 100 | 100 | 100 | 100 | 100 | 100 | 100 | 100 |
| Conductive film (W) | | W1 | ○ | ○ | ○ | ○ | ○ | ○ | ○ | — | — | — | ○ |
| | | W2 Titanium triethanol aminate | — | — | — | — | — | — | — | ○ | — | — | — |
| | | W3 Titanium triethanol aminate | — | — | — | — | — | — | — | — | ○ | ○ | — |
| Sample configuration | | Out-cell type | ○ | ○ | ○ | ○ | ○ | ○ | ○ | ○ | ○ | ○ | — |
| | | Cover-glass integrated type | — | — | — | — | — | — | — | — | — | — | ○ |
| Evaluation results | Light resistance | View area | ◉ | ◉ | ○ | ○ | ◉ | ◉ | ◉ | ○ | ○ | ◉ | ◉ |
| | | End part of shield part | ◉ | ◉ | ○ | ○ | ◉ | ◉ | ○ | ○ | ○ | ○ | ◉ |
| | | Evaluation of driving of touch panel | ○ | ○ | ○ | ○ | ○ | ○ | ○ | ○ | ○ | ○ | ○ |

| | | Item | Ex. 12 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|
| Photosensitive resin composition solution (X) | (A) | (A1) | 60 | 60 | 60 | 60 | 60 | 60 | 60 |
| | (B) | Trimethylolpropane triacrylate | 40 | 40 | 40 | 40 | 40 | 40 | 40 |
| | (C) | 1,2-octanediaone, 1-[4-(phenythio)phenyl-, 2-(O-benzolyloxime)] | 1.5 | 1.5 | 1.5 | 1.5 | 1.5 | 1.5 | 1.5 |
| | (D) | Titanium diisopropoxy-bis (acetylacetonate) | 3 | — | — | — | — | — | — |
| | | Titanium tetraacetylacetonate | — | — | — | — | — | — | — |
| | | Zirconium tetraacetylacetonate | — | — | — | — | — | — | — |
| | | Aluminum trisacetylacetonate | — | — | — | — | — | — | — |
| | | Titanium oxide particles | — | — | — | — | — | — | — |
| | (E) | 3-(phenylamino)propyltri-methoxysilane | — | — | — | — | 5 | — | 5 |
| | | 2,4-diamino-6-phenyl-1,3,5-triazine | — | — | — | — | — | 5 | — |
| | UV absorbing agent | Ethyl 2-cyano-3,3-diphenyl-acrylate | 3 | — | 5 | — | — | — | — |
| | Others | Octamethylcyclotetrasiloxane | 0.1 | 0.1 | 0.1 | 0.1 | 0.1 | 0.1 | 0.1 |
| | | Methyl ethyl ketone | 100 | 100 | 100 | 100 | 100 | 100 | 100 |
| Conductive film (W) | | W1 | ○ | ○ | ○ | ○ | ○ | ○ | ○ |
| | | W2 Titanium triethanol aminate | — | — | — | — | — | — | — |
| | | W3 Titanium triethanol aminate | — | — | — | — | — | — | — |

TABLE 2-continued

| | | | | | | | | |
|---|---|---|---|---|---|---|---|---|
| Sample configuration | Out-cell type | — | ○ | ○ | ○ | ○ | — | — |
| | Cover-glass integrated type | ○ | — | — | — | — | ○ | ○ |
| Evaluation results | Light resistance  View area | ◎ | Δ | X X | ◎ | ○ | X | ◎ |
| | End part of shield part | ◎ | X X | X X | X X | X X | X | X X |
| | Evaluation of driving of touch panel | ○ | X | X | X | X | X | X |

As shown in Table 2, irrespective of the configurations of the samples of Examples 1 to 12 that contained a metal additive as the component (D) and irrespective of the part that contained a metal additive (see Examples 8 to 10), these touch panels were excellent in light resistance in both the view area and the shield part, and driving of the touch panels was excellent.

On the other hand, as shown in Table 2, Comparative Examples 1, 2 and 5 that did not contain the metal additive (D) and the amine additive (E) had poor light resistance in both the view area and the shield part and driving of the tough panel was poor even if a UV absorbing agent was used.

Comparative Examples 3, 4 and 6 that did not contain the metal additive (D) but contained the amine additive (E), light resistance was poor in the end part of the shield part and driving of the touch panel was poor.

INDUSTRIAL APPLICABILITY

By using the photosensitive conductive film of the invention, it is possible to form a sensor electrode (conductive pattern) in which an increase resistance or disconnection under exposure to sunlight or light from a xenon lamp does not occur. The photosensitive conductive film of the invention can be used for formation of a conductive pattern that is used as an electrode wiring of an apparatus such as a flat panel display (e.g. liquid crystal display device), a touch screen, a solar battery and a lightening.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The Japanese application specification claiming priority under the Paris Convention are incorporated herein by reference in its entirety.

The invention claimed is:

1. A laminate which comprises a substrate, a resin layer provided on the substrate, and a conductive film comprising conductive fibers provided on the resin layer, wherein the resin layer includes at least one metal additive different from the conductive fibers, and wherein, in said laminate, a ratio of increase in resistance after irradiation with light emitted from a xenon lamp at an intensity of 60 W/m$^2$ (integrated value of spectral irradiance at a wavelength of 300 nm to 400 nm) for 300 hours is 20% or less, wherein the at least one metal additive comprises a metal complex compound represented by the following formula (3):

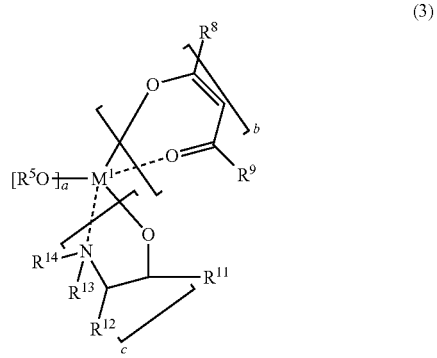

(3)

wherein M$^1$ is a metal atom selected from aluminum, titanium, and zirconium, R$^5$ is independently an alkyl group having 1 to 18 carbon atoms, R$^8$ and R$^9$ are independently a hydrogen atom, a hydroxyl group, an alkyl group having 1 to 18 carbon atoms, an alkyl alcohol residue having 1 to 18 carbon atoms or an aminoalkyl group having 1 to 18 carbon atoms, R$^{11}$ to R$^{14}$ are a hydrogen atom, a hydroxy group, an alkyl group having 1 to 18 carbon atoms or a hydroxyalkyl group having 1 to 18 carbon atoms, a is an integer of 0 to 4, b is an integer of 0 to 4, c is an integer of 0 to 4, and the sum of a, b and c is 3 or 4.

2. A touch panel comprising the laminate according to claim 1, wherein the touch panel has a shield part.

3. The laminate according to claim 1, wherein the conductive fibers are silver fibers.

4. The laminate according to claim 1, wherein the thickness of the conductive film is 5 nm to 0.1 μm.

5. The laminate according to claim 1, wherein the fiber diameter of the conductive fibers is 1 nm to 50 nm and, wherein the fiber length of the conductive fibers is 1 μm to 100 μm.

6. The laminate according to claim 1, wherein the resin layer further comprises an amine additive, and wherein the amine additive comprises an amino group-containing silane compound.

7. The laminate according to claim 1, wherein the resin layer comprises a polymer obtained by polymerization of photopolymerizable compound and a binder polymer.

* * * * *